(12) United States Patent
Nakajima et al.

(10) Patent No.: US 10,139,431 B2
(45) Date of Patent: Nov. 27, 2018

(54) MEASUREMENT SYSTEM

(71) Applicant: RION CO., LTD., Tokyo (JP)

(72) Inventors: Yasutaka Nakajima, Tokyo (JP);
Kiyokatsu Iwahashi, Tokyo (JP);
Masaharu Ohya, Tokyo (JP);
Toshihiro Ueta, Tokyo (JP); Naru Sato, Tokyo (JP); Ryota Hotta, Tokyo (JP); Yu Kurosawa, Tokyo (JP); Yuichi Yonemoto, Tokyo (JP)

(73) Assignee: RION CO., LTD., Tokyo (JP)

( * ) Notice: Subject to any disclaimer, the term of this patent is extended or adjusted under 35 U.S.C. 154(b) by 650 days.

(21) Appl. No.: 14/401,971

(22) PCT Filed: May 8, 2013

(86) PCT No.: PCT/JP2013/002964
§ 371 (c)(1),
(2) Date: Nov. 18, 2014

(87) PCT Pub. No.: WO2013/171999
PCT Pub. Date: Nov. 21, 2013

(65) Prior Publication Data
US 2015/0168457 A1    Jun. 18, 2015

(30) Foreign Application Priority Data

May 18, 2012   (JP) ................................ 2012-115000

(51) Int. Cl.
*G01R 1/30*    (2006.01)
*H03M 1/12*    (2006.01)
(Continued)

(52) U.S. Cl.
CPC .............. *G01R 1/30* (2013.01); *G01H 11/00* (2013.01); *H03M 1/12* (2013.01); *H04Q 9/00* (2013.01);
(Continued)

(58) Field of Classification Search
USPC ......... 702/56, 141, 150, 179, 184, 188, 189; 340/539.11; 705/2
See application file for complete search history.

(56) References Cited

U.S. PATENT DOCUMENTS 4,887,162 A  * 12/1989  Arai ................... H04N 1/32619
358/400
8,994,556 B2 *  3/2015  Lundy .................... G08C 17/02
340/539.11

(Continued)

FOREIGN PATENT DOCUMENTS

JP   H09-130871     5/1997
JP   H11-355331    12/1999
(Continued)

OTHER PUBLICATIONS

Partial European Search Report dated Dec. 4, 2015 in corresponding European Patent Application No. 13790218.5.
(Continued)

*Primary Examiner* — Manuel L Barbee
(74) *Attorney, Agent, or Firm* — Troutman Sanders LLP

(57) ABSTRACT

If input signal is transmitted to a main body unit, a sensor amplifier stores the input signal in itself as measurement data, and transmits the input signal with the added transfer order information to the main body unit. By checking the transfer order information added to the input signal, the main body unit can confirm if the input signal is deficient or not. Upon the end of the measurement of the physical quantity, the main body unit transmits the retransmission request that requests the retransmission of the deficient portion of the data to the sensor amplifier. According to the retransmission request from the main body unit, the sensor amplifier extracts the deficient portion of the input signal data stored in itself and retransmits the extracted input signal data to the main body unit.

2 Claims, 13 Drawing Sheets

(51) Int. Cl.
*H04Q 9/00* (2006.01)
*G01H 11/00* (2006.01)
*H04W 52/02* (2009.01)

(52) U.S. Cl.
CPC .... *H04W 52/0235* (2013.01); *H04Q 2209/40* (2013.01); *H04Q 2209/43* (2013.01); *H04Q 2209/845* (2013.01)

(56) References Cited

U.S. PATENT DOCUMENTS

| | | | |
|---|---|---|---|
| 2002/0081979 | A1 | 6/2002 | Okuya et al. |
| 2005/0286617 | A1* | 12/2005 | Lilja ................. H04W 52/0232 375/219 |
| 2006/0052678 | A1* | 3/2006 | Drinan ................. A61B 5/0531 600/301 |
| 2006/0103546 | A1 | 5/2006 | Salser, Jr. et al. |
| 2007/0081486 | A1 | 4/2007 | Koide |
| 2008/0004904 | A1* | 1/2008 | Tran ..................... A61B 5/0006 705/2 |
| 2010/0033424 | A1 | 2/2010 | Kabasawa et al. |
| 2010/0083020 | A1 | 4/2010 | Suzuki |
| 2010/0329163 | A1 | 12/2010 | Aoki |

FOREIGN PATENT DOCUMENTS

| | | |
|---|---|---|
| JP | 2001-188980 | 7/2001 |
| JP | 2002-188953 | 7/2002 |
| JP | 2003-006780 | 1/2003 |
| JP | 2006-064393 | 3/2006 |
| JP | 2009-049602 | 3/2009 |
| JP | 2009-099040 | 5/2009 |
| JP | 2010-078369 | 4/2010 |
| JP | 2010-114766 | 5/2010 |
| JP | 2011-128791 | 6/2011 |
| WO | 2009/022562 | 2/2009 |

OTHER PUBLICATIONS

Extended European Search Report dated Mar. 14, 2016, for the corresponding European Patent Application No. 13790218.5.

Office Action from the Examining Division dated Dec. 21, 2016 in corresponding European Patent Application No. 13790218.5.

International Search Report dated Aug. 20, 2013, which issued during prosecution of International Application No. PCT/JP2013/002964.

* cited by examiner

MEASUREMENT SYSTEM

CROSS REFERENCE TO RELATED APPLICATIONS

This application is a U.S. National Phase Application under 35 U.S.C. § 371 of International Patent Application No. PCT/JP2013/002964 filed May 8, 2013, which claims priority to Japanese Patent Application No. 2012-115000 filed May 18, 2012. The International Application was published on Nov. 21, 2013, as International Publication No. WO 2013/171999 under PCT Article 21(2). The entire contents of these applications are hereby incorporated by reference.

TECHNICAL FIELD

This invention relates to a measurement system for measuring physical quantities.

BACKGROUND ART

Objects to be measured are various in types, and require their own measurement apparatuses to fit their individual measurement circumstances. In other words, measurement has been desired to deal with various measuring objects, not just sound and vibration but also temperature, humidity, pressure, and the like.

Techniques for measuring sound, noise, and the like are disclosed (see, for example, Patent Document 1: JP-A-2002-188953, Patent Document 2: JP-A-2006-64393, and Patent Document 3: JP-A-2010-78369). The technique according to Patent Document 1 is to transmit actual sound (noise) when a noise level exceeds a control level. Specifically, the noise level of noise can be measured with a microphone and a sound level meter. If the noise level is greater than a control level, it establishes a call with PHS (Personal Handyphone System) and allows an operator to hear the actual sound through the PHS.

Patent Document 2 discloses a system for measuring acoustic characteristics, which is configured to accurately measure the acoustic characteristics of a space such as a hall or a stadium. The grasping of acoustic characteristics is an important factor not just when music is played but also when clear announcement is desired.

Moreover, Patent Document 3 discloses an environmental data collecting/analyzing apparatus configured to collect and analyze a particular environmental data signal for noise or vibration and display the data on the printed paper or screen. According to Patent Document 3, the attribute of the graph line is made different to enable the visual recognition of the environmental data signal that is not to be measured. This facilitates the analysis of the measurement data for the noise or vibration, and the object to be measured and the object not to be measured can be easily distinguished.

As disclosed in Patent Documents above, various measurement circumstances are assumed generally in the measurement of the sound and vibration. As the examples, the traffic noise on the road and the noise from the railway, the measurement of the sound insulation performance, the measurement of the insulation of an automobile, and the measurement of the noise and vibration at the construction site are given.

In these cases, there are various pieces of data desired to be obtained at the measurement and various measurement locations depending on the measurement circumstances. When the measurement circumstances vary, various problems occur as below.

(1) In the case of transmitting measurement data wirelessly, there are possibilities that the measurement data are lost. The wireless communication causes a trouble more often than the wired communication. Moreover, disconnection may happen in the middle of the communication. If the measurement data are lost (if the measurement data have become deficient) in the middle of wireless communication, the reliability of the measurement is deteriorated. When the retransmission of the measurement data is repeatedly requested, the communication speed fails to follow the accumulation of the measurement data, in which case a measurer cannot know the current measurement data and information in the measurement.

(2) If the measurement data are wirelessly transmitted with the operation of the battery, a problem of the consumption power occurs. That is to say, if the measurement data are obtained remotely without the man power, the measurement data are continuously transmitted wirelessly. This increases the consumption power, which results in that the battery is changed more frequently. Moreover, the standby time may be long if the measurement is conducted not continuously but intermittently after the installation of the measurement device and the sensor.

(3) In the current technique, the device for processing a plurality of (three or more) channel signals in real time is large-scaled. When the device is large-scaled, the size, the weight, the consumption power (battery life), and the cost of the device are adversely affected.

(4) In the use of a plurality of measurement devices, if the measurement devices conduct measurement separately, the measurement start time cannot be synchronized. Therefore, the uniform process in regard to the time synchronization is impossible. Unless the uniform process is performed, the measurement data obtained by the measurement is not uniform. This results in a problem that the work efficiency of the operator in the subsequent work is deteriorated.

In view of the background as above, a technique has been desired that can flexibly deal with the loss of the data in the wireless communication. Moreover, a technique has been desired that can reduce the power consumption in the use of the wireless communication. Additionally, a technique has been desired that can effectively use the hardware resources. Furthermore, a technique has been desired that can manage a plurality of measurement devices efficiently.

CITATION LIST

Patent Documents

PATENT DOCUMENT 1: JP-A-2002-188953
PATENT DOCUMENT 2: JP-A-2006-64393
PATENT DOCUMENT 3: JP-A-2010-78369

SUMMARY OF INVENTION

The invention disclosed herein employs the solutions as below. In each of the following solutions, the citation relation and the subordinate relation may be changed as appropriate.

Solution 1: A measurement system according to this solution includes: a conversion unit in a sensor amplifier connected to a sensor configured to output an analog signal corresponding to a physical quantity of a measuring object, the conversion unit being configured to convert the analog signal inputted from the sensor into a digital signal; a data storage unit in the sensor amplifier, the data storage unit being configured to store the digital signal as measurement data; a sensor amplifier communication unit in the sensor amplifier, the sensor amplifier communication unit being configured to transmit the digital signal to the outside of the sensor amplifier using a wireless communication function; a main body communication unit in a main body unit paired with the sensor amplifier, the main body communication unit being configured to receive the digital signal transmitted from the sensor amplifier using a wireless communication function; a data generation unit in the main body unit, the data generation unit being configured to generate the measurement data based on the received digital signal; a deficiency information notification unit in the main body unit, the deficiency information notification unit being configured to notify, if the digital signal transmitted from the sensor amplifier is deficient, the sensor amplifier of deficiency information representing a deficient portion through the main body communication unit; and a retransmission execution unit in the sensor amplifier, the retransmission execution unit being configured to, if the notification of the deficiency information has been received from the main body unit through the sensor amplifier communication unit, retransmit the deficient portion of the measurement data stored in the data storage unit based on the deficiency information to the main body unit through the sensor amplifier communication unit.

The measurement system according to this solution includes the sensor amplifier. The sensor amplifier has the sensor connected thereto, the sensor being configured to output the analog signal corresponding to the physical quantity of the measuring object (the information based on the measurement, such as the sound, the vibration, the temperature, the humidity, and the pressure). The sensor amplifier converts the analog signal inputted from the sensor into digital signal. The digital signal is stored in a memory or the like as the measurement data. The sensor amplifier transmits the digital signal to the outside of the sensor amplifier using a wireless communication function.

The measurement system according to this solution includes the main body unit. The main body unit is a device paired with the sensor amplifier. The main body unit receives the digital signal transmitted from the sensor amplifier using the wireless communication function. Based on the received digital signal, the measurement data are generated. The generated measurement data can be, for example, stored in the memory of the main body unit, subjected to a signal process in the main body unit, or displayed on a display unit of the main body unit.

Here, if the digital signal transmitted from the sensor amplifier is deficient, the main body unit notifies the sensor amplifier of the deficiency information representing the deficient portion. Whether or not the digital signal is deficient can be determined by, for example, checking the frame number or the like given to the digital signal. The deficiency information can be set as the information including the information of the deficient frame number or the like. Upon the reception of the notification of the deficiency information in the sensor amplifier from the main body unit, the sensor amplifier retransmits the deficient portion of the measurement data to the main body unit based on the deficiency information after the completion of a series of measurements so that the entire pieces of measurement data are acquired by the main body unit.

In general, the wireless communication causes the communication failure more often than the wired communication. Thus, the communication may be disconnected. In this case, if the digital signal obtained by the measurement is lost in the middle of the wireless communication (if the data have become deficient), the reliability of the measurement is deteriorated. Moreover, in the measurement, it is important to monitor the latest information. When the retransmission of the measurement data is repeatedly requested, however, the communication speed fails to follow the accumulation of the measurement data, in which case a measurer cannot know the current measurement data and information in the measurement.

Therefore, in this solution, the digital signal transmitted wirelessly is stored in the sensor amplifier as the measurement data. If the digital signal transmitted from the sensor amplifier is deficient, the pieces of measurement data stored in the sensor amplifier are automatically retransmitted to the main body unit. Therefore, even if some pieces of the digital signals are lost in the occurrence of the communication failure, the stored pieces of measurement data are retransmitted to the main body unit. Thus, the lost digital signals can be recovered. Moreover, it is possible to avoid the situation in which the latest information cannot be monitored due to the delay of data transfer caused by the repeated data retransmission.

Solution 2: In the measurement system in this solution according to the solution 1, the deficiency information notification unit notifies the deficiency information after reception of a series of the digital signals by the main body communication unit is ended.

In this solution, the deficiency information is notified after the reception of the series of the digital signals is ended. Therefore, even if the digital signal is deficient, the retransmission process is not performed before the end of the reception of the series of the digital signals.

According to this solution, the real-time transfer and the batch transfer can be combined. Therefore, it is possible to achieve both the checking if the correct measurement is performed or not and the acquisition of the complete pieces of data finally. In other words, if the deficiency of data is found in the execution of the real-time transfer and the retransmission of the data is executed at that time, the delay occurs in the transmission of the data that should be transmitted originally. In this case, the real-time property cannot be maintained. In this solution, however, the batch transfer of the deficient portion can be performed after the end of the transmission of the data that should be transmitted originally. Thus, the data transfer method in which the real-time transfer and the batch transfer are effectively combined can be achieved.

In this point, the pieces of data to be transmitted may be stored in the end and then transmitted wirelessly. In this case, however, the real-time property is deteriorated and it takes time to acquire the data. In contrast, this solution provides the effect that the real-time property can be achieved and moreover the final data acquisition time can be shortened because just the deficient portion of the data is subjected to the batch transfer in the final batch transfer.

Solution 3: The measurement system in this solution according to the solution 1, wherein the deficiency information notification unit: notifies the deficiency information when it is determined that the digital signal is deficient; ends a retransmission request process according to the notification of the deficiency information in a certain period of time if the deficient portion of the measurement data is not retransmitted even after the notification of the deficiency information; and further has a continuous reception process execution unit that executes a continuous reception process which makes the main body communication unit continuously keep receiving a series of the digital signal if the retransmission request process according to the notification of the deficiency information is ended in a certain period of time by the deficiency information notification unit.

In this solution, the main body unit notifies the deficiency information upon determination that the digital signal is deficient. If the deficient portion of measurement data is not retransmitted even after the notification of the deficiency information, the main body unit ends the retransmission request process based on the notification of the deficiency information in a certain period of time. If the retransmission request process is ended in a certain period of time, the continuous reception process of continuously executing the reception of the series of the digital signals is executed.

Thus, in this solution, the main body unit executes the retransmission request process upon determination that the digital signal is deficient. If the retransmission request process is disabled by some kind of communication failure, the main body unit ends the retransmission request process in a certain period of time instead of continuing the retransmission request process forever.

In general, there can be various communication failures. For example, an instant communication failure and a long communication failure are given. In the occurrence of the instant communication failure, the time for which the communication cannot be carried out is short. Therefore, if the retransmission request process is performed upon determination that the digital signal is deficient, the communication may be already recovered. In that case, the real-time property can be further improved and the latest measurement data can be continuously monitored by retransmitting the deficient portion of the measurement data at that time. In this solution, however, if the communication failure is not eliminated, the retransmission request process is cancelled after a certain period of time. By not continuing the retransmission request process forever, the deterioration in real-time property due to the retransmission request process is suppressed.

Solution 4: A measurement system according to this solution includes: a first sensor amplifier communication unit in a sensor amplifier connected to a sensor configured to output an analog signal corresponding to a physical quantity of a measuring object, the first sensor amplifier communication unit having a wireless communication function; a second sensor amplifier communication unit in the sensor amplifier, the second sensor amplifier communication unit having a wireless communication function with a power consumption less than that of the first sensor amplifier communication unit; a first main body communication unit in a main body unit paired with the sensor amplifier, the first main body communication unit having a wireless communication function and being paired with the first sensor amplifier communication unit to communicate therewith; a second main body communication unit in the main body unit, the second main body communication unit having a wireless communication function with a power consumption less than that of the first main body communication unit and being paired with the second sensor amplifier communication unit to communicate therewith; a notification unit for an instruction of shifting to a low-power consumption mode in the main body unit, the notification unit being configured to, for shifting a mode of the sensor amplifier from a normal power mode to a low-power consumption mode with a power consumption less than that of the normal power mode, notify the sensor amplifier of an instruction of shifting to a low-power-consumption mode for shifting to the low-power consumption mode through the first main body communication unit or the second main body communication unit; a low-power consumption mode shift unit in the sensor amplifier, the low-power consumption mode shift unit being configured to, upon reception of notification of the instruction of shifting to a low-power-consumption mode from the main body unit through the first sensor amplifier communication unit or the second sensor amplifier communication unit, shift the first sensor amplifier communication unit from an operating state to a suspended state and maintain the operating state of the second sensor amplifier communication unit; a notification unit for an instruction of shifting to a normal power mode in the main body unit, the notification unit being configured to, for shifting a mode of the sensor amplifier from the low-power consumption mode to the normal power mode, notify the sensor amplifier of an instruction of shifting to a normal power mode for shifting to the normal power mode through the second main body communication unit; and a normal power mode shift unit in the sensor amplifier, the normal power mode shift unit being configured to, upon reception of notification of the instruction of shifting to the normal power mode from the main body unit through the second sensor amplifier communication unit, shift the first sensor amplifier communication unit from the suspended state to the operating state.

The measurement system according to this solution includes the sensor amplifier. The sensor amplifier has the sensor connected thereto, the sensor being configured to output the analog signal corresponding to the physical quantity of the measuring object. The sensor amplifier includes the first sensor amplifier communication unit having the wireless communication function, and the second sensor amplifier communication unit having the wireless communication function with a power consumption less than that of the first sensor amplifier communication unit.

The measurement system according to this solution includes the main body unit. The main body unit is a device paired with the sensor amplifier. The main body unit has the wireless communication function. The main body unit includes the first main body communication unit and the second main body communication unit. The first main body communication unit is paired with the first sensor amplifier communication unit to perform the communication. The second main body communication unit has the wireless communication function with a power consumption less than that of the first main body communication unit, and is paired with the second sensor amplifier communication unit to perform the communication. Thus, the first sensor amplifier communication unit and the first main body communication unit are paired to perform the wireless communication. The second sensor amplifier communication unit and the second main body communication unit are similarly paired to perform the wireless communication.

In this solution, the sensor amplifier shifts to the low-power consumption mode for reducing the power consumption of the sensor amplifier, or returns from the low-power consumption mode to the normal power mode. The flow of the process of the mode shift is described below.

[Shift to Low-power Consumption Mode]

When the mode of the sensor amplifier is shifted from the normal power mode to the low-power consumption mode, the main body unit notifies the sensor amplifier of the instruction of shifting to a low-power consumption mode. Upon the reception of the notification of the instruction of shifting to a low-power consumption mode in the sensor amplifier from the main body unit, the sensor amplifier shifts the state of the first sensor amplifier communication unit from the operating state to the suspended state. The operating state of the second sensor amplifier communication unit is maintained. The operating state of the second sensor amplifier communication unit is maintained for the purposes of maintaining the communication with the main body unit and making the first sensor amplifier communication unit return from the suspended state to the operating state.

[Shift to Normal Power Mode]

For shifting the mode of the sensor amplifier from the low-power consumption mode to the normal power mode, the main body unit notifies the sensor amplifier of the instruction of shifting to a normal power mode. Upon the reception of the notification of the instruction of shifting to the normal power mode in the sensor amplifier from the main body unit, the sensor amplifier shifts the first sensor amplifier communication unit from the suspended state to the operating state.

For dealing with the long-time measurement with the sensor amplifier, it is necessary to suppress the power consumption as much as possible. Depending on the measurement circumstances, the measurement data may be unnecessary in the main body unit for a while. Therefore, if the main body unit determines that the measurement data are unnecessary, the sensor amplifier can be shifted to the low-power consumption mode. In addition, if the main body unit determines that the measurement data are necessary again, the sensor amplifier can be shifted to the normal power mode.

By shifting the first sensor amplifier communication unit to the suspended state, the power consumption of the sensor amplifier can be suppressed. Even after the sensor amplifier shifts to the low-power consumption mode, however, the operating state of the second sensor amplifier communication unit is maintained. Therefore, the communication state between the main body unit and the sensor amplifier is secured. Even after the sensor amplifier shifts to the low-power consumption mode, the cooperation between the main body unit and the sensor amplifier is maintained. The second sensor amplifier communication unit is a device that consumes low power. Therefore, the reduction of power consumption is not interrupted.

Solution 5: In the measurement system in this solution according to the solution 4, the low-power consumption mode includes a first low-power consumption mode and a second low-power consumption mode with a power consumption less than that of the first low-power consumption mode; the sensor amplifier includes a main control unit configured to control a measurement state of the sensor and a sub-control unit with a power consumption less than that of the main control unit; the notification unit for an instruction of shifting to a low-power-consumption mode notifies, for making the sensor amplifier continue to measure the physical quantity and stop the communication, the sensor amplifier of the instruction of shifting to a low-power-consumption mode corresponding to the first low-power consumption mode and for making the sensor amplifier stop to measure the physical quantity and stop the communication, the sensor amplifier of the instruction of shifting to a low-power-consumption mode corresponding to the second low-power consumption mode; and the low-power consumption mode shift unit shifts the first sensor amplifier communication unit from the operating state to the suspended state upon reception of the notification of the instruction of shifting to a low-power-consumption mode corresponding to the first low-power consumption mode, and shifts the main control unit and the first sensor amplifier communication unit from the operating state to the suspended state upon reception of the notification of the instruction of shifting to a low-power-consumption mode corresponding to the second low-power consumption mode.

In this solution, two kinds of modes are employed as the low-power consumption mode: the first low-power consumption mode and the second low-power consumption mode with a power consumption less than that of the first low-power consumption mode. The sensor amplifier includes the main control unit (such as main microcomputer) that controls the measurement state of the sensor, and a sub-control unit (such as sub-microcomputer) with a power consumption less than that of the main control unit.

In this solution, for achieving the reduction of power consumption in accordance with the measurement circumstances, the sensor amplifier shifts to one of the two low-power consumption modes. The flow of the process when the sensor amplifier shifts to any of the two kinds of low-power consumption modes is described below.

For stopping the communication while the sensor connected to the sensor amplifier continues the measurement of the physical quantity, the main body unit notifies the sensor amplifier of the instruction of shifting to a low-power consumption mode corresponding to the first low-power consumption mode. For stopping the communication while the sensor connected to the sensor amplifier stops the measurement of the physical quantity, the main body unit notifies the sensor amplifier of the instruction of shifting to a low-power consumption mode corresponding to the second low-power consumption mode.

Upon the reception of the instruction of shifting to a low-power-consumption mode corresponding to the first low-power consumption mode, the sensor amplifier shifts the first sensor amplifier communication unit from the operating state to the suspended state. Upon the reception of the instruction of shifting to a low-power consumption mode corresponding to the second low-power consumption mode, the sensor amplifier shifts the main control unit and the first sensor amplifier communication unit from the operating state to the suspended state.

In other words, in the execution of the shift into the first low-power consumption mode, the first sensor amplifier communication unit is suspended. Therefore, the communication with the first sensor amplifier communication unit is no longer possible. The main control unit is, however, in the operating state. Therefore, the measurement of the physical quantity using the sensor can be continued.

In the execution of the shift into the second low-power consumption mode, the main control unit and the first sensor amplifier communication unit are suspended. Therefore, the communication with the first sensor amplifier communication unit is no longer possible. Further, the measurement of the physical quantity using the sensor is suspended. However, if the main control unit and the first sensor amplifier communication unit have shifted to the suspended state, the power consumption can be reduced more than in the case where the mode has shifted to the first low-power consumption mode.

In this manner, in this solution, the two control units with different power consumption and the two communication units with different power consumption are mounted. By changing the device to be shifted to the suspended state depending on the measurement situations, the reduction of power consumption in accordance with various measurement circumstances can be achieved.

Solution 6: A measurement system according to this solution includes: a conversion unit in a sensor amplifier to which a plurality of sensors configured to output analog signals corresponding to a physical quantity of a measuring object is connected, the conversion unit being configured to convert the analog signals inputted from the sensors into digital signals; a sensor amplifier data processing unit in the sensor amplifier, the sensor amplifier data processing unit being configured to compute the digital signals for part of the plurality of sensors according to the setting content for a predetermined rule of data processing; a sensor amplifier communication unit in the sensor amplifier, the sensor amplifier communication unit being configured to transmit the unprocessed digital signals and the computed digital signals to the outside of the sensor amplifier; a main body communication unit in a main body unit paired with the sensor amplifier, the main body communication unit being configured to receive the unprocessed digital signals and the computed digital signals transmitted from the sensor amplifier; and a main body data processing unit in the main body unit, the main body data processing unit being configured to compute the unprocessed digital signals for the rest of the plurality of sensors out of the received digital signals.

The measurement system according to this solution includes the sensor amplifier. The sensor amplifier has the plurality of sensors connected thereto, the sensors configured to output the analog signals corresponding to the physical quantity of the measuring object. Thus, the measurement in multiple channels is conducted in the sensor amplifier.

The sensor amplifier converts the analog signals inputted from the sensors into digital signals. The sensor amplifier performs the data processing according to the content of setting for a predetermined rule of the data processing (for example, rule defining on which channel and by which of the main body unit and the sensor amplifier the data processing is performed). In other words, the sensor amplifier performs the data processing on digital signals corresponding to part of the sensors (for example, in the case of the measurement for three channels, the measurement for one channel). Then, the sensor amplifier transmits the unprocessed digital signals and the computed digital signals to the outside of the sensor amplifier.

The measurement system according to this solution includes the main body unit. The main body unit is a device paired with the sensor amplifier. The main body unit receives the unprocessed digital signals and the computed digital signals, which have been transmitted from the sensor amplifier. The main body unit then computes the unprocessed digital signals corresponding to the remaining sensor among the plurality of sensors out of the received digital signals (for example, in the measurement for the three channels, the measurement for the remaining two channels).

Thus, according to this solution, the data processing can be shared between the main body unit and the sensor amplifier. This enables the effective use of the hardware resources. Moreover, the data quantity of the digital signal that has been computed in the sensor amplifier decreases depending on the content of the data processing. Therefore, by performing the data processing in the sensor amplifier, the communication load can be reduced. Moreover, in this solution, the data processing is distributed for each of the channels of the plurality of sensors. Therefore, the criterion for distributing the data processing is clarified. Thus, the control process can be simplified.

Solution 7: In a measurement system according to this solution, a plurality of sensor amplifiers is connected to one main body unit, and the system includes: a sensor connected to the sensor amplifier and configured to output an analog signal corresponding to a physical quantity of a measuring object; a notification unit for a measurement start instruction in the main body unit, the notification unit being configured to, for making the sensor connected to each of the plurality of sensor amplifiers start to measure the physical quantity, notify each of the plurality of sensor amplifiers of a measurement start instruction; and a measurement execution unit in each of the plurality of sensor amplifiers, the measurement execution unit being configured to, upon reception of the notification of the measurement start instruction from the main body unit with the notification unit for a measurement start instruction, make the sensor connected to the sensor amplifier having received the notification start to measure the physical quantity.

In the measurement system according to this solution, one main body unit has the plurality of sensor amplifiers connected thereto. Each of the sensor amplifiers has the sensor connected thereto, the sensor being configured to output the analog signal corresponding to the physical quantity of the measuring object.

Here, for making the sensor connected to each of the plurality of the sensor amplifiers starts to measure the physical quantity, the main body unit notifies each of the plurality of the sensor amplifiers of the measurement start instruction. Then, upon the reception of the measurement start instruction from the main body unit, the sensor amplifier causes the sensor connected to the sensor amplifier that has received the notification to start to measure the physical quantity.

Thus, according to this solution, the plurality of sensor amplifiers connected to one main body unit can be linked to be operated by using the measurement start instruction. This enables the uniform measurement in regard to the time synchronization. Moreover, in this solution, the sensor amplifiers located apart from each other can start the measurement at the same time. This reduces the burden on the operator.

Solution 8: In a measurement system according to this solution, a plurality of main body units is connected through a predetermined network, and the system includes: a sensor amplifier connected to each of the plurality of main body units; a sensor connected to the sensor amplifier and being configured to output an analog signal corresponding to a physical quantity of a measuring object; a notification unit for a measurement start instruction in any one of the plurality of main body units, the notification unit being configured to, for making the sensor connected to the sensor amplifier start to measure the physical quantity, notify the other main body units of a measurement start instruction through the predetermined network; and a measurement execution unit in the other main body units, the measurement execution unit being configured to, upon reception of the notification of the measurement start instruction through the predetermined network, make the sensor connected to the sensor amplifier connected to the main body unit having received the notification start to measure the physical quantity.

In the measurement system according to this solution, the plurality of main body units is connected via a predetermined network. Each of the plurality of main body units has the sensor amplifier connected thereto. The sensor amplifier has the sensor connected thereto, the sensor being configured to output the analog signal corresponding to the physical quantity of the measuring object.

Here, in the case where the sensor connected to each sensor amplifier starts the measurement of the physical quantity, any one of the plurality of main body units notifies other main body units of the measurement start instruction through the predetermined network. Upon the reception of the notification of the measurement start instruction, each of the other main body units causes the sensor connected to the sensor amplifier connected to the main body unit having received the notification to start to measure the physical quantity.

Thus, according to this solution, the other main body units can be notified of the measurement start instruction through the predetermined network. Therefore, as long as the network system is ready, one main body unit can control other main body units located apart from each other. Thus, in this solution, one main body unit uses the measurement start instruction to operate the plurality of main body units linked to be operated. As the result, the main body units, the measurement unit, and the sensors located apart from each other can be managed.

The invention disclosed above provides the effects as described below.

(1) The sensor amplifier stores the digital signal transmitted wirelessly as the measurement data. For this function, upon the reception of the notification of the deficiency information from the main body unit, the sensor amplifier retransmits the deficient portion of the measurement data to the main body unit. Therefore, even though the data in the wireless communication is deficient, the data can be compensated later.

(2) In this measurement system, two different kinds of communication units are selectively used depending on the circumstances. This can efficiently reduce the power consumption.

(3) Each of the main body unit and the sensor amplifier is provided with the data processing unit. By distributing the data processing, the hardware resources can be used effectively.

(4) By using the measurement start instruction from the main body unit, the sensor connected to each of the plurality of sensor amplifiers can start the measurement. This enables the uniform measurement in regard to the time synchronization.

DESCRIPTION OF EMBODIMENTS

An embodiment is hereinafter described with reference to the drawings.

Figure 1:
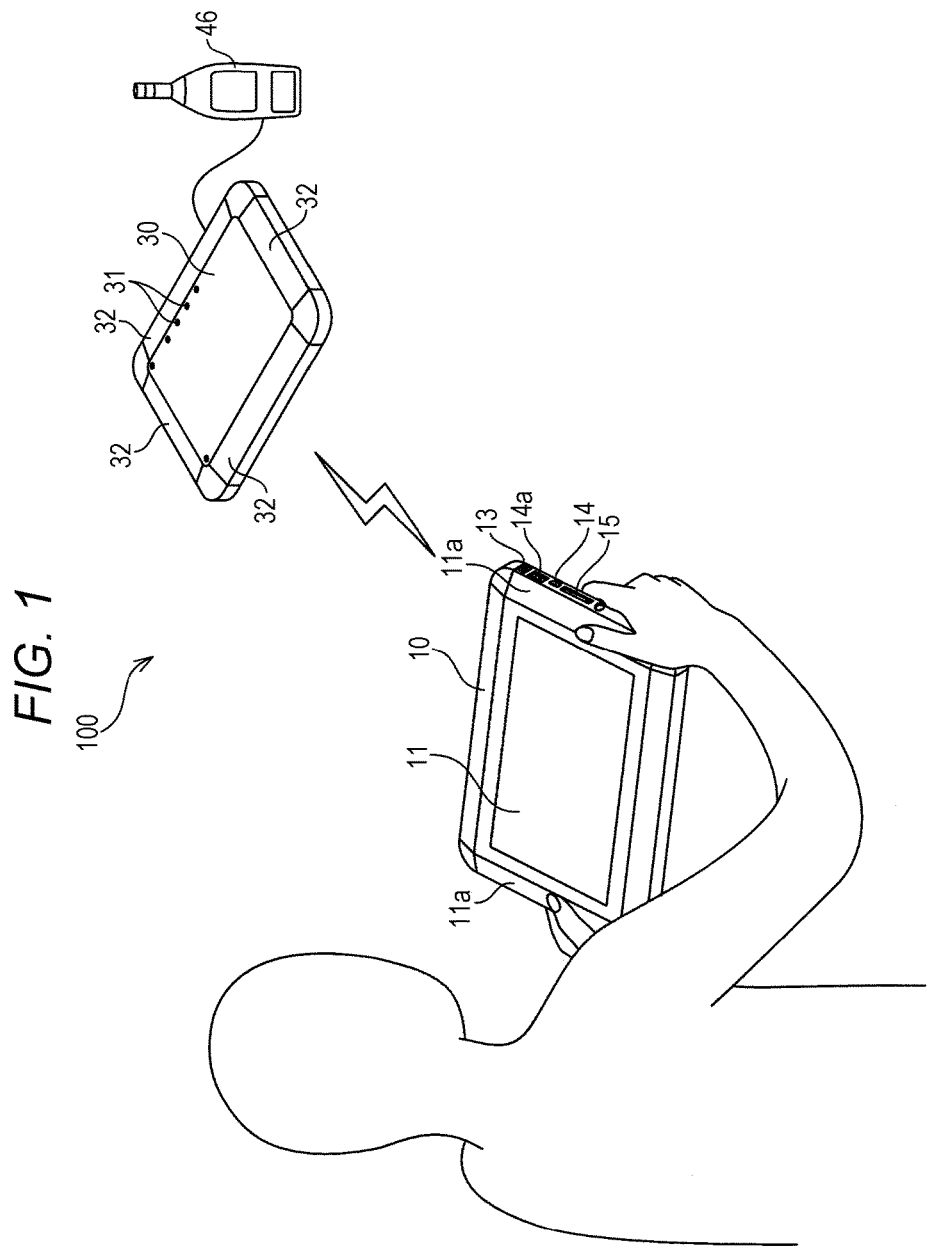
FIG. 1 is a schematic diagram illustrating a measurement system 100 according to an embodiment.

FIG. 1 is a schematic diagram illustrating a measurement system 100 according to an embodiment. The measurement system 100 is an apparatus for measuring the physical quantity such as sound, vibration, temperature, humidity, and pressure. The measurement system 100 includes a main body unit 10 and a sensor amplifier 30. The main body unit 10 and the sensor amplifier 30 exchange data wirelessly.

[Main Body Unit]

The main body unit 10 has a rectangular solid shape with a flat external shape. The main body unit 10 is a tablet-type terminal (tablet terminal) with a portable size for an operator.

The main body unit 10 includes, on a surface, a liquid crystal display unit 11 that displays various pieces of information (such as icons, information on digital signals, and waveforms of various pieces of data). The liquid crystal display unit 11 is provided with a touch panel used for operating the measurement system 100. An operator can operate the main body unit 10 by touching the display on the screen.

The main body unit 10 has inclined plane 11a on its periphery. The total thickness gradually decreases from the surface with the liquid crystal display unit 11 toward the outside direction. The inclined plane 11a or its neighboring portion is used as a holding portion that enables the operator to hold the main body unit 10. Corner portions of the main body unit 10 are chamfered to be an arc-like shape. The size of the main body unit 10 can be set to, for example, A4-size sheet (approximately 210 mm vertically and 297 mm horizontally) in plane view.

A right-side surface of the main body unit 10 is provided with a terminal 13 for an AC adaptor, a LAN (Local Area Network) port 14, a USB (Universal Serial Bus) port 14a, and a card slot 15 for enabling the insertion of a card-shaped recording medium.

[Sensor Amplifier]

Figure 2:
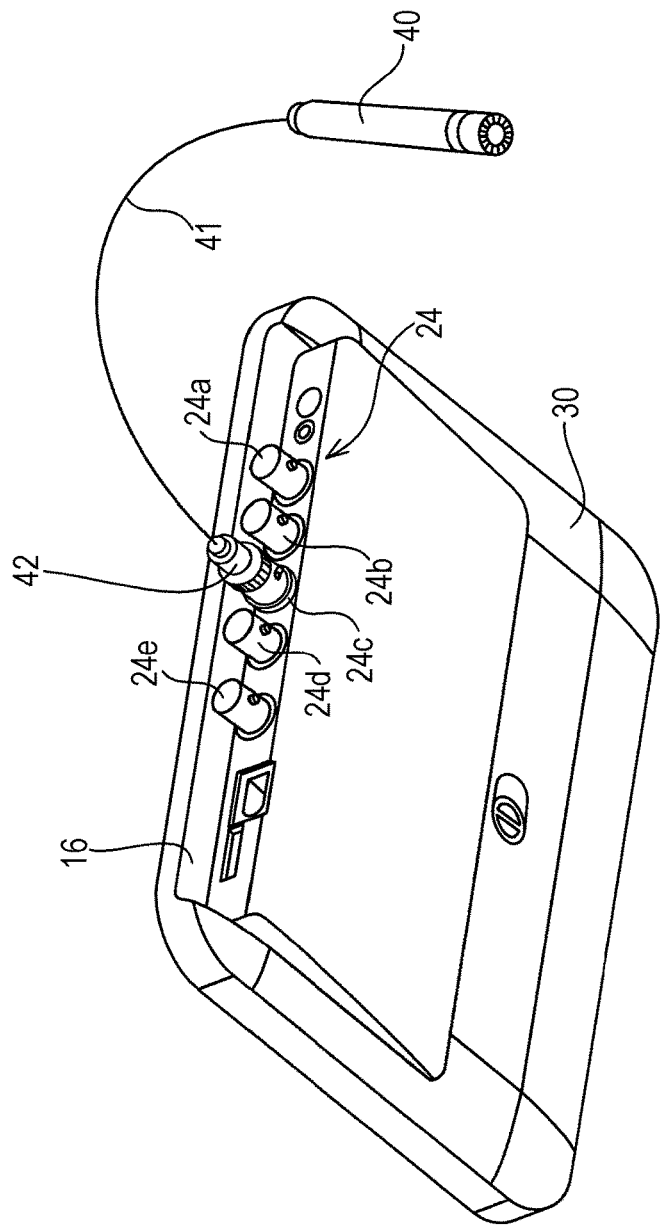
FIG. 2 is a perspective view illustrating a state in which a sensor amplifier 30 is viewed from a rear surface side.

FIG. 2 is a perspective view illustrating a state in which the sensor amplifier 30 is viewed from a rear surface side. The sensor amplifier 30 has a rectangular solid shape with a flat external shape. The sensor amplifier 30 is a device with a portable size for an operator.

An input unit 24 includes four connectors 24a, 24b, 24c, and 24d, and one connector 24e. To the connectors 24a, 24b, 24c, and 24d, the signal(s) (analog signal or digital signal) representing the physical quantity is inputted. The connector 24e outputs the signal(s) other than the analog signal. The four connectors 24a, 24b, 24c, and 24d have various kinds of sensors connected thereto through cables. Therefore, the four connectors 24a, 24b, 24c, and 24d enable the measurement of four channels. In the illustrated example, the connector 24c has a measurement microphone 40 connected thereto through a cable 41 and a connecting plug 42. Note that the input terminal of the sensor amplifier 30 can have, instead of the measurement microphone 40, a vibration pickup, a temperature/humidity sensor, a pressure sensor, or the like connected thereto. The connector 24e has, for example, an external appliance such as a speaker connected thereto through a cable. Thus, the connector 24e can output the signal other than the analog signal to the external appliance. The allocation of the input/output of the connectors is not limited to the above example. The allocation of the input/output of the connectors can be changed depending on the specification or design.

As illustrated in FIG. 1, the sensor amplifier 30 has inclined plane 32 on the periphery thereof. The total thickness gradually decreases toward the outside direction from a surface with openings 31 used to check the light emission state of a light-emitting diode. Corner portions of the sensor amplifier 30 are chamfered to be an arc-like shape.

[Basic Measurement]

The measurement system 100 illustrated in FIG. 1 is basically used as below. For example, the operator brings the main body unit 10, the sensor amplifier 30, and a sound level meter 46 to the measurement site.

The operator sets the sound level meter 46 to the sensor amplifier 30, and locates the sound level meter 46 connected to the sensor amplifier 30 at the measurement point. By holding a neighboring portion to the inclined plane 11a, the operator operates the main body unit 10 with the liquid crystal display unit 11 of the main body unit 10 while holding the main body unit 10. Thus, the operator measures the sound with the sound level meter 46 connected to the sensor amplifier 30. The data measured with the sound level meter 46 are wirelessly transmitted to the main body unit 10 through the sensor amplifier 30. Therefore, the operator can check the measurement result on the spot while viewing the liquid crystal display unit 11.

[Example of Connection]

Next, the example of connection in which the main body unit 10 and the sensor amplifier 30 are used is described.

[First Example of Connection]

Figure 3:
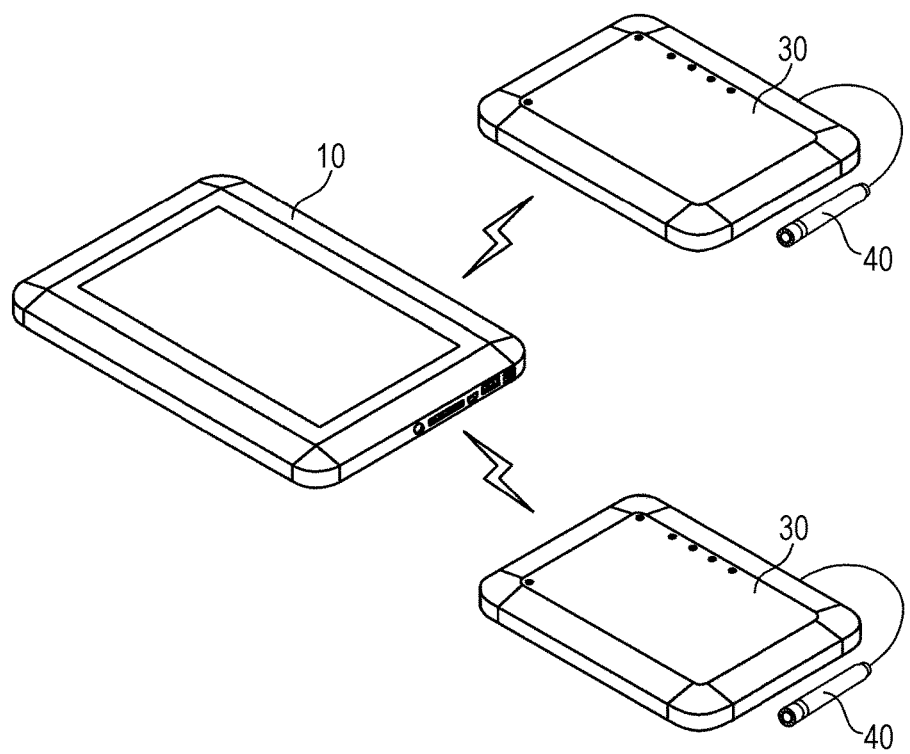
FIG. 3 illustrates an example of connection in which a plurality of sensor amplifiers 30 is connected wirelessly to one main body unit 10.

FIG. 3 is a diagram illustrating an example of connection in which a plurality of sensor amplifiers 30 is connected wirelessly to one main body unit 10. In the illustrated example, each sensor amplifier 30 has the microphone 40 connected thereto. According to this example, in case a multipoint measurement is required, the requirement can be flexibly met by increasing the number of sensor amplifiers 30 according to the requirement.

[Second Example of Connection]

Figure 4:
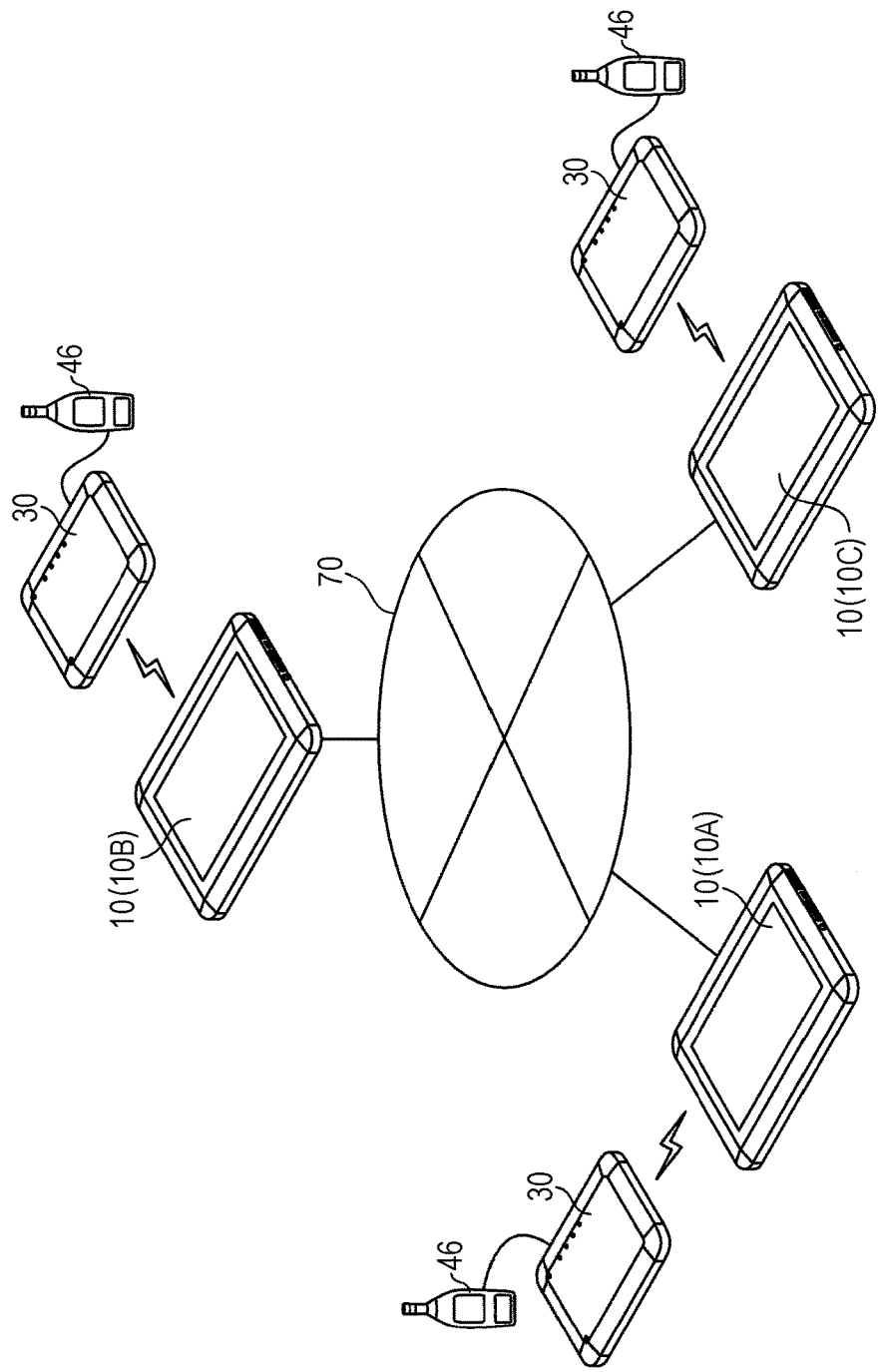
FIG. 4 illustrates an example of connection in which a plurality of main body units 10 is connected to each other through a network 70.

FIG. 4 is a diagram illustrating an example of connection in which a plurality of main body units 10 is connected through a network 70. In this example of connection, the plurality of main body units 10 is used. The main body units 10 are connected to each other through the network 70 such as communication networks of the cellular phone, the Internet etc. In the illustrated example, the three main body units 10 (10A, 10B and 10C) are connected through the network 70. The main body unit 10A is a control unit that controls other main body units 10B and 10C.

Here, the sensor amplifiers 30 provided with the sound level meters 46 are connected to each of the main body units 10A, 10B, and 10C wirelessly.

The main body unit 10A transmits, for example, a control signal through the network 70. This enables the main body unit 10A to control the other main body units 10B and 10C. Specifically, the main body unit 10A transmits the measurement start instruction to the other main body units 10B and 10C through the network 70. Thus, the main body unit 10A enables the other main body units 10B and 10C to conduct the measurement. The main body unit 10A transmits the data transmission request to the other main body units 10B and 10C through the network 70. Thus, the main body unit 10A can receive the measurement data from the other main body units 10B and 10C.

[Structure for Control]

Figure 5:
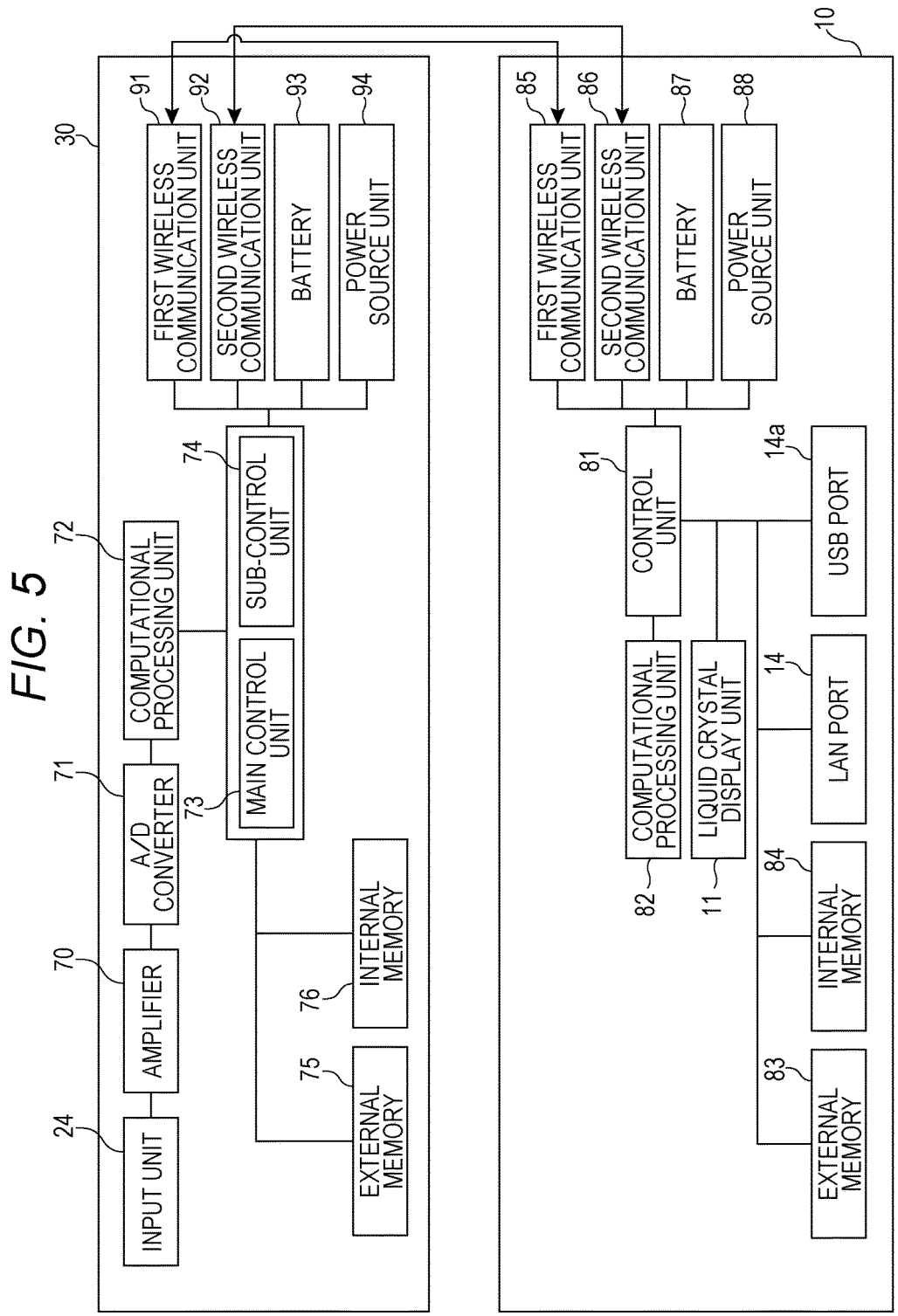
FIG. 5 is a block diagram schematically illustrating a structure of the main body unit 10 and the sensor amplifier 30.

Next, a structure in regard to control of the measurement system is described. FIG. 5 is a block diagram schematically illustrating a structure of the main body unit 10 and the sensor amplifier 30.

[Sensor Amplifier]

The sensor amplifier 30 includes the input unit 24, an amplifier 70, an A/D converter 71, a data processing unit 72, a main control unit 73, a sub-control unit 74, an external memory 75, an internal memory 76, a first wireless communication unit 91, a second wireless communication unit 92, a battery 93 and a power source unit 94.

The input unit 24 is the interface to which input signals (including the digital signal) representing the physical quantity are inputted from various kinds of sensors connected to the sensor amplifier 30. To the input unit 24, the input signals may be inputted from other external appliance than the sensors.

The amplifier 70 is the device that, if the input signal inputted to the input unit 24 is an analog signal, amplifies the analog signal. The A/D converter 71 is the device that converts the analog input signal amplified by the amplifier 70 into the digital input signal (conversion unit).

The data processing unit 72 is a data processing device (sensor amplifier data processing unit). This data processing device computes the digital input signal obtained by the conversion in the A/D converter 71. The data processing unit 72 includes, for example, a DSP (Digital Signal Processor). Examples of the data processing performed by the data processing unit 72 include the FFT (Fast Fourier Transform) and the process of the content to be encoded or decoded for the wireless communication. If the data processing is not necessary, the data processing unit 72 does not perform the data processing.

The main control unit 73 includes a CPU (Central Processing Unit, central data processing device) (main microcomputer, microprocessor, main controller). The main control unit 73 has a function of controlling the operations and the processes executed by the sensor amplifier 30.

The sub-control unit 74 includes a CPU (sub-microcomputer, sub-controller). The sub-control unit 74 controls the operating state and the suspended state of the main control unit 73. The main control unit 73 and the sub-control unit 74 control the emission state of the light-emitting diode, etc.

The external memory 75 is the external storage device (data storage unit) that can be attached to the sensor amplifier 30. The external memory 75 corresponds to, for example, a micro SD card.

The internal memory 76 is the storage device (data storage unit) provided in advance for the sensor amplifier 30. For example, the internal memory 76 corresponds to, for example, a ROM (Read Only Memory) or a RAM (Random Access Memory).

The first wireless communication unit 91 is the interface for exchanging the input signals (including the digital signal) and various pieces of data with a first wireless communication unit 85 of the main body unit 10 using the wireless communication function (first sensor amplifier communication unit). The first wireless communication unit 91 is the communication unit capable of high-speed communication. The first wireless communication unit 91 can employ, for example, Wi-Fi (Wi-Fi is the registered trademark in Japan) in which the communication specification IEEE802.11 is used. Since the first wireless communication unit 91 is capable of high-speed communication, the first wireless communication unit 91 is the communication unit that needs high power consumption.

The second wireless communication unit 92 is the interface for exchanging the input signals (including the digital signal) and various pieces of data with a second wireless communication unit 86 of the main body unit 10 using the wireless communication function (second sensor amplifier communication unit). The second wireless communication unit 92 is the communication unit with a lower communication speed than the first wireless communication unit 91. For example, the second wireless communication unit 92 can employ the ZigBee (ZigBee is the registered trademark in Japan) as one of the short-range wireless communication specifications. The second wireless communication unit 92 consumes a small amount of power. Therefore, the second wireless communication unit 92 consumes less power than the first wireless communication unit 91. In other words, the first wireless communication unit 91 consumes more power though the transfer speed is high and the second wireless communication unit 92 consumes less power though the transfer speed is low.

The first power consumption (high power consumption) is higher than the second power consumption (low power consumption) (this similarly applies to the description below). The high-speed communication is the first communication. The low-speed communication is the second communication. The first communication has higher communication speed than the second communication (this similarly applies to the description below).

Here, when the signal inputted from the sensor is transmitted from the sensor amplifier 30 to the main body unit 10, the communication is conducted using the first wireless communication units 85 and 91. In the case of exchanging control signals between the sensor amplifier 30 and the main body unit 10, the communication is conducted using the second wireless communication units 86 and 92.

The battery 93 is configured to include secondary batteries reusable after a battery charge.

The power source unit 94 is the device as a source of driving the sensor amplifier 30. The necessary power is generated when the power source unit 94 takes in the power from an AC adaptor, a dry battery etc., which is not illustrated. The generated power is distributed to every part of the wireless communication unit 30. Note that the battery 93 stores the power distributed from the power source unit 94. The sensor amplifier 30 operates on the power from the battery 93 or the power source unit 94. Thus, the sensor amplifier 30 includes the battery 93. Therefore, when the power supply from the power source unit 94 is stopped temporarily such as when the battery is changed, the sensor amplifier 30 can be operated continuously.

Here, the main control unit 73 of the sensor amplifier 30 is the control unit that controls the first wireless communication unit 91 and the second wireless communication unit 92 of the sensor amplifier 30. The sub-control unit 74 controls the main control unit 73. Moreover, the sub-control unit 74 controls the first wireless communication unit 91 and the second wireless communication unit 92. The sub-control unit 74 is the control unit with lower power consumption than the main control unit 73. The main control unit 73 controls the measurement state of the sensor connected to the sensor amplifier 30.

[Main Body Unit]

The main body unit 10 includes a control unit 81, a data processing unit 82, an external memory 83, an internal memory 84, the liquid crystal display unit 11, the first wireless communication unit 85, the second wireless communication unit 86, a battery 87, a power source unit 88, the LAN port 14, and the USB port 14a.

The control unit 81 includes a CPU. The control unit 81 has a function of controlling any operation and process which the main body unit 10 conducts. Note that, according to the input signal through the liquid crystal display unit 11, the control unit 81 controls, every part of the main body unit 10 and also the image display on the liquid crystal display unit 11.

The data processing unit 82 is a data processing device (main body data processing unit). This data processing device computes the input signal received from the sensor amplifier 30. This data processing unit 82 includes, for example, a DSP etc. The data processing unit 82 executes, for example, the FFT (Fast Fourier Transform) and the generation of measurement data (data generation unit) according to the received input signal.

The external memory 83 is the external storage device that can be attached to the main body unit 10. The external memory 83 is, for example, an SD card.

The internal memory 84 is the storage device provided in advance for the sensor amplifier 30. The internal memory 84 is, for example, a ROM or a RAM. The internal memory 84 includes the application software for generally controlling the measurement system 100, analyzing the digital data or converting the data into numerals.

The first wireless communication unit 85 is the interface for exchanging the data with the sensor amplifier 30 using the wireless communication function (first main body communication unit). The first wireless communication unit 85 is the communication unit capable of high-speed communication. The first wireless communication unit 85 can employ, for example, Wi-Fi (Wi-Fi is the registered trademark in Japan) in which the communication specification IEEE802.11 is used. Since the first wireless communication unit 85 is capable of high-speed communication, the first wireless communication unit 85 is the communication unit that needs high power consumption.

The second wireless communication unit 86 is the interface for exchanging the data with the sensor amplifier 30 using the wireless communication function (second main body communication unit). The second wireless communication unit 86 is the communication unit with lower communication speed than the first wireless communication unit 85. For example, the second wireless communication unit 86 can employ the ZigBee (ZigBee is the registered trademark in Japan) as one of the short-range wireless communication specifications. The second wireless communication unit 86 consumes a small amount of power. Therefore, the second wireless communication unit 86 consumes less power than the first wireless communication unit 85. In other words, the first wireless communication unit 85 consumes more power though the transfer speed is high and the second wireless communication unit 86 consumes less power though the transfer speed is low.

The battery 93 is configured to include secondary batteries reusable after a battery charge.

The power source unit 88 is the device as a source of driving the main body unit 10. The necessary power is generated when the power source unit 88 takes in the power from an AC adaptor, a dry battery etc., which is not illustrated. The generated power is distributed to each unit of the main body unit 10. Note that the battery 87 stores the power distributed from the power source unit 88. The main body unit 10 operates on the power from the battery 87 or the power source unit 88. Thus, the main body unit 10 includes the battery 87. Therefore, when the power supply from the power source unit 88 is stopped temporarily such as when the battery is changed, the main body unit 10 can be operated continuously.

The LAN port 14 and the USB port 14*a* are the interfaces that connect between the main body unit 10 and an external devices, which is not shown (such as a personal computer, a device on a network, or another measuring instrument).

Figure 6:
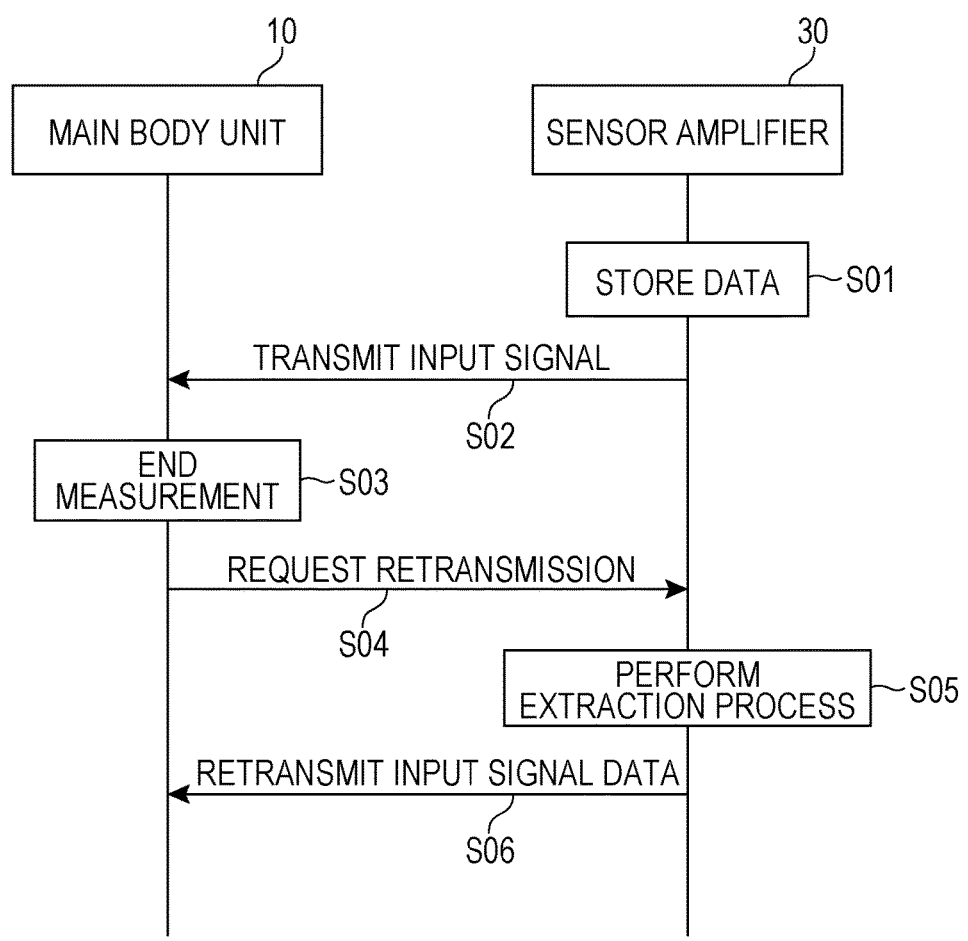
FIG. 6 is a sequence diagram illustrating a first procedure example of buffering the measurement data.

Next, the process for buffering the measurement data is described. Two procedure examples can be employed in the buffering process for the measurement data. Here, a first procedure example is described. FIG. 6 is a sequence diagram illustrating the first procedure example of the buffering process for the measurement data.

[Real-time Transfer]

Step S01: in the case of transmitting the input signal from the sensor amplifier 30 to the main body unit 10, the sensor amplifier 30 stores the input signal in itself (data storage unit). Specifically, the sensor amplifier 30 stores the input signal as the measurement data in the external memory 75 or the internal memory 76. At this point, the measurement data obtained by adding the transfer order information (such as frame number information) representing the order of transfer to the measurement data are stored.

Step S02: the sensor amplifier 30 transmits the input signal with the added transfer order information to the main body unit 10. In the transmission of the input signal, the data stored in the external memory 75 or the internal memory 76 may be transited to the transfer buffer and then the data may be transmitted. Alternatively, after the input signal from the sensor is transited to the buffer for the transmission directly, the data may be transmitted.

Step S03: the main body unit 10 keeps receiving a series of input signals from the sensor amplifier 30. Upon the end of the measurement in the sensor amplifier 30, the reception of the series of the input signals is ended.

[Batch Transfer]

Here, the main body unit 10 can confirm whether the input signal is deficient or not by checking the transfer order information added to the input signal. Here, it is assumed that n-th to (n+m)-th input signals have been lost due to a trouble occurred in the communication.

Step S04: in this case, the main body unit 10 transmits the retransmission request of the n-th to (n+m)-th input signals to the sensor amplifier 30 (deficiency information notification unit). The retransmission request includes the deficiency information representing the deficient portion of the input signals. The main body unit 10 notifies the sensor amplifier 30 of the retransmission request through the second wireless communication unit 86.

Step S05: the sensor amplifier 30 executes the extraction process for extracting the n-th to (n+m)-th input signal data from the external memory 75 or the internal memory 76 according to the retransmission request from the main body unit 10. Step S06: the sensor amplifier 30 retransmits the extracted n-th to (n+m)-th input signal data to the main body unit 10 (retransmission execution unit). Specifically, the sensor amplifier 30 retransmits the extracted input signal data (measurement data) corresponding to the deficient portion to the main body unit 10 through the first wireless communication unit 91.

Even in the wireless communication, the deficiency of measurement data is not allowed. Moreover, it is necessary for the operator to monitor the latest data at the present point.

In this regard, this control method satisfies both requirements, and only the deficient portion of the data has to be retransmitted as the input signal. Thus, the volume of the data to be retransmitted can be reduced.

According to the first procedure example described above, the main body unit 10 executes the retransmission request process after the end of the reception of the series of the input signals. Therefore, the sensor amplifier 30 can perform the batch transfer of the deficient portion after the end of the transmission of the data that should be transmitted originally. Therefore, it is possible that only the deficient portion of the data is transmitted in a batch transfer at the end. Thus, the real-time property can be maintained and the final data acquisition time can be shortened.

Figure 7:
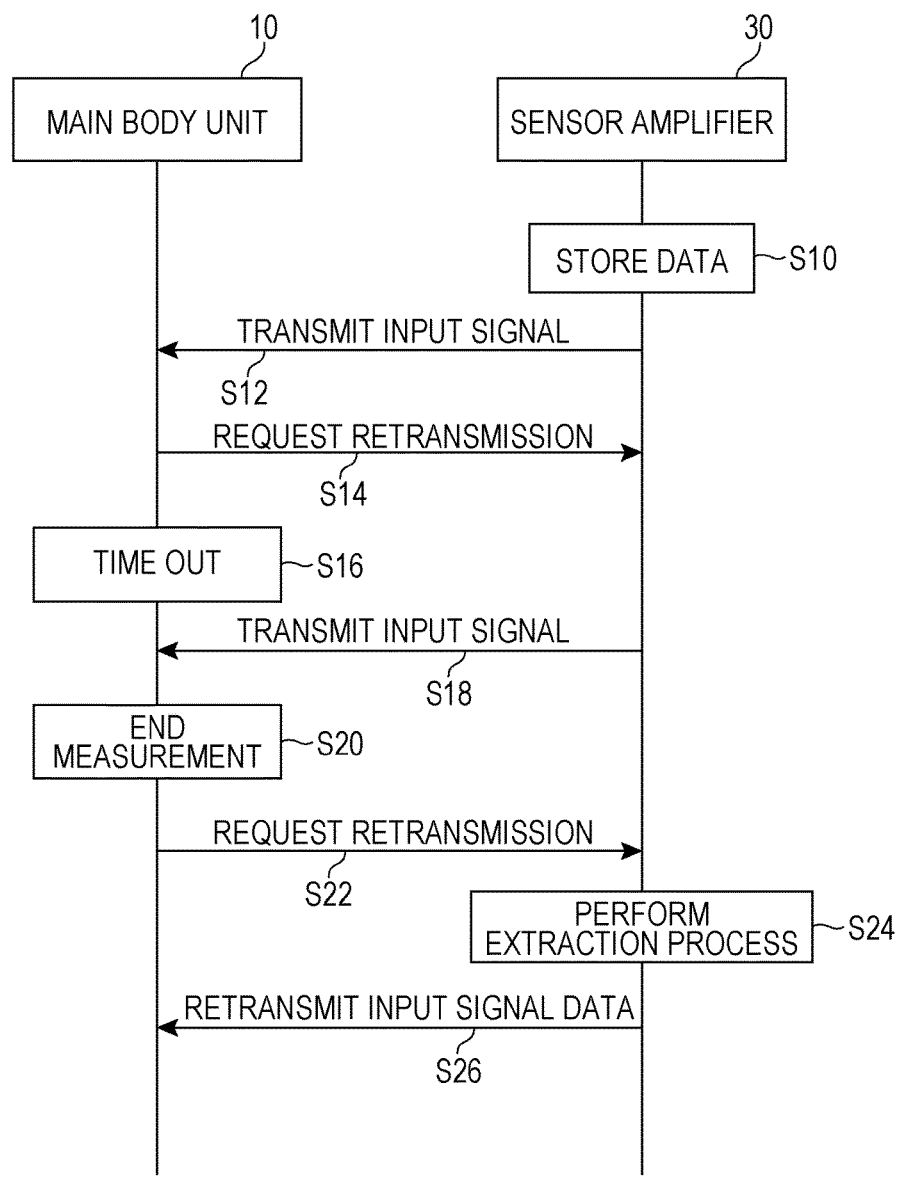
FIG. 7 is a sequence diagram illustrating a second procedure example of buffering the measurement data.

FIG. 7 is a sequence diagram illustrating a second procedure example of the buffering process for the measurement data. The first procedure example describes the procedure example in which the batch transfer is conducted after the real-time transfer. The second procedure example describes the procedure example in which the batch transfer is executed in the middle of the real-time transfer.

[Real-time Transfer]

Step S10: in the case of transmitting the input signal to the main body unit 10, the sensor amplifier 30 stores the input signal in itself (data storage unit). Specifically, the sensor amplifier 30 stores the input signal as the measurement data in the external memory 75 or the internal memory 76. At this point, the measurement data obtained by adding the transfer order information (such as frame number information) representing the order of transfer to the input signal is stored.

Step S12: the sensor amplifier 30 transmits the input signal with the transfer order information to the main body unit 10. Here, the main body unit 10 can confirm whether the input signal is deficient or not by checking the transfer order information added to the input signal. Here, it is assumed that n-th to (n+m)-th input signals have been lost due to a trouble occurred in the communication.

Step S14: in this case, the main body unit 10 transmits the retransmission request of the n-th to (n+m)-th input signals to the sensor amplifier 30. In other words, upon determination that the input signal is deficient, the main body unit 10 executes the retransmission request process by notifying the sensor amplifier 30 of the deficiency information. If the sensor amplifier 30 has transmitted the deficient portion of the input signal data according to the retransmission request, the main body unit 10 continues the receiving process for the input signal.

Step S16: on the other hand, if the sensor amplifier 30 does not retransmit the deficient portion of the input signals even after the main body unit 10 transmits the retransmission request, the main body unit 10 calls a time-out of the retransmission request process to the sensor amplifier 30 in a certain period of time (for example, several seconds) for monitoring the latest measurement state.

Step S18: after the time-out of the retransmission request process in a certain period of time, the main body unit 10 executes the continuous receiving process in which the latest input signals (a series of digital signals) from the sensor amplifier 30 (continuous reception process execution unit) remain to be constantly received. Specifically, the main body unit 10 causes the first wireless communication unit 85 to receive a series of input signals continuously. Note that, the sensor amplifier 30 keeps storing the measurement data (input signals) in the external memory 75 or the internal memory 76 for the backup.

[Batch Transfer]

Step S20: the main body unit 10 keeps receiving a series of input signals from the sensor amplifier 30. Upon the end of the measurement in the sensor amplifier 30, the reception of the series of the input signals is ended.

Step S22: the main body unit 10 checks the transmission order information added to the input signals. Thus, the deficient portion of the input signals can be confirmed. Therefore, the main body unit 10 transmits the retransmission request for requesting the retransmission of only the n-th to (n+m)-th input signal data.

Step S24: according to the retransmission request from the main body unit 10, the sensor amplifier 30 executes the extraction process for extracting the n-th to (n+m)-th input signal data from the external memory 75 or the internal memory 76. Step S26: the sensor amplifier 30 retransmits the extracted n-th to (n+m)-th input signal data to the main body unit 10 (retransmission execution unit).

According to the second procedure example described above, the real-time property can be further improved and the latest measurement data can be continuously monitored by executing the retransmission request process when the data deficiency is found. In the second procedure example, however, if the communication failure is not eliminated, the retransmission request process is canceled in a certain period of time. Thus, the retransmission request process is not continued forever. Thus, it is possible to avoid the situation in which the real-time property is deteriorated by the retransmission request process.

Figure 8:
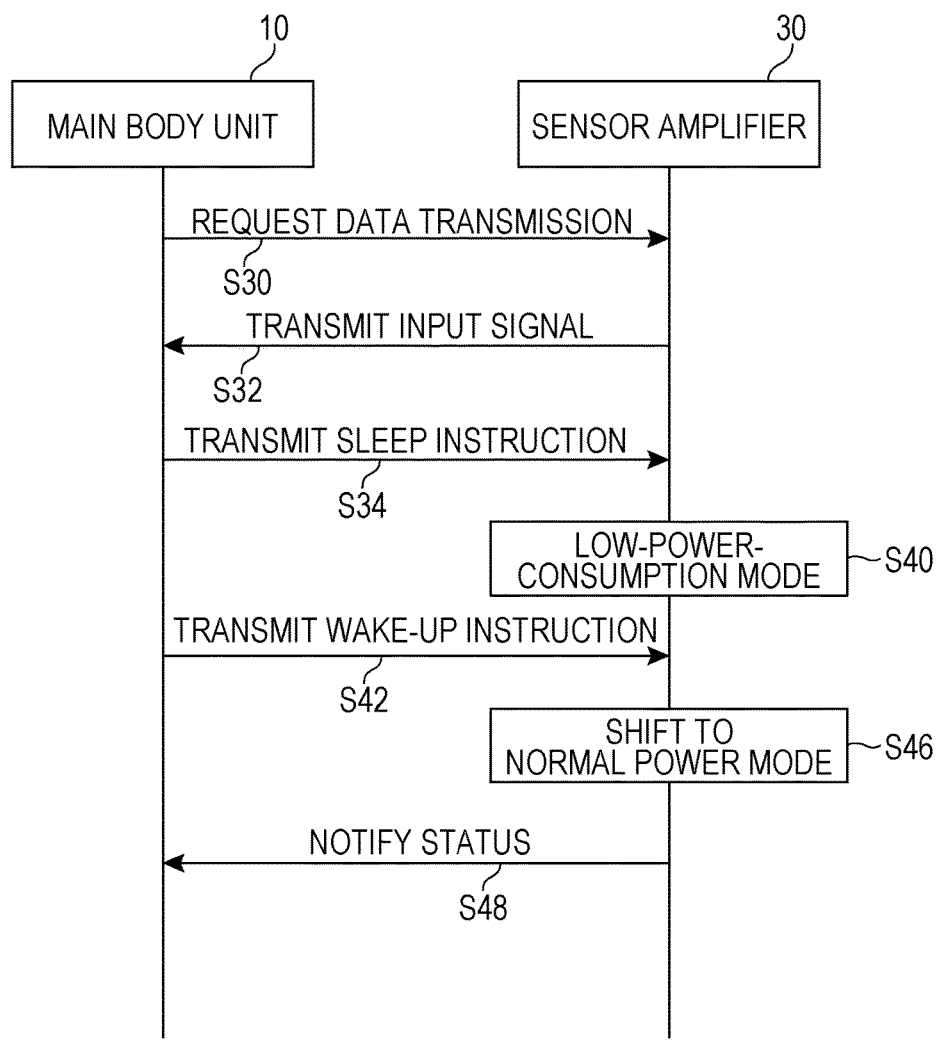
FIG. 8 is a sequence diagram illustrating a procedure example of shifting the mode to the normal power mode or the low-power consumption mode.

Next, the normal power mode and the low-power consumption mode are described. FIG. 8 is a sequence diagram illustrating the procedure example when the mode shifts to the normal mode or the low-power consumption mode.

[Normal Mode]

Step S30: the main body unit 10 requests the sensor amplifier 30 to transmit the input signal (data transmission request).

Step S32: the sensor amplifier 30 transmits the input signal to the main body unit 10 according to the data transmission request from the main body unit 10. In the data transfer, the communication is conducted using the first wireless communication unit 85.

[Shift to Low-power Consumption Mode]

Step S34: if the input signal is not needed for a while (for example in the period of time between one and another shellfires in the measurement of shellfire sounds) for the main body unit 10, the main body unit 10 determines to shift the mode of the sensor amplifier 30 from the normal power mode to the low-power consumption mode with the power consumption less than that of the normal power mode. In this case, the main body unit 10 notifies the sub-control unit 74 of the sensor amplifier 30 of the sleep instruction (instruction of shifting to a low-power consumption mode) for shifting the mode to the low-power consumption mode through the second wireless communication unit 86 (notification unit for an instruction of shifting to a low-power consumption mode).

Step S40: the sub-control unit 74 of the sensor amplifier 30, having received the sleep instruction, shifts the state of the main control unit 73 and the first wireless communication unit 91 in its own device, or just the first wireless communication unit 91, from the operating state to the suspended state.

Here, in this embodiment, two kinds of low-power consumption modes are employed. The first mode is to shift the first wireless communication unit 91 from the operating state to the suspended state. Moreover, the first mode maintains the measurement state (makes the sensor continue to measure) by operating the main control unit 73 (semi-sleep mode: first low-power consumption mode). The second mode is to shift not just the first wireless communication unit 91 but also the main control unit 73 from the operating state to the suspended state. Thus, the second mode shifts the main control unit 73 to the non-measurement state (makes the sensor stop the measurement) (full-sleep mode: second low-power consumption mode).

The selection between the two kinds of modes is conducted according to the mode selection information included in the sleep instruction. The sensor amplifier 30 shifts the first wireless communication unit 91 from the operating state to the suspended state upon the reception of the notification of the sleep instruction corresponding to the first low-power consumption mode. The sensor amplifier 30 shifts the main control unit 73 and the first wireless communication unit 91 from the operating state to the suspended state upon the reception of the notification of the sleep instruction corresponding to the second low-power consumption mode.

In any case, upon the reception of the sleep instruction, the main control unit 73 and the first wireless communication unit 91 of the sensor amplifier 30 can be shifted to the low-power consumption mode (low-power consumption mode shift unit). The sub-control unit 74 and the second wireless communication unit 92, however, are operated with the low power. Thus, the power consumption can be drastically reduced.

[Shift to Normal Power Mode]

Step S42: for shifting a mode of the sensor amplifier 30 from the low-power consumption mode to the normal power mode, the main body unit 10 transmits the wake-up instruction (instruction of shifting to a normal power mode) for shifting to the normal power mode to the sub-control unit 74 of the sensor amplifier 30 through the second wireless communication unit 86 (notification unit for an instruction of shifting to a normal power mode).

Step S46: upon the reception of the wake-up instruction, the sub-control unit 74 of the sensor amplifier 30 shifts the suspended main control unit 73 and the suspended first wireless communication unit 91 to the operating state (normal power mode shift unit).

Thus, the main control unit 73 and the first wireless communication unit 91 of the sensor amplifier 30 can be shifted to the normal power mode. Even if the wake-up instruction is not received, the sensor amplifier 30 may be shifted from the low-power consumption mode to the normal power mode after passing a certain period of time (for example, several minutes or several hours).

Step S48: the sensor amplifier 30 notifies that the mode has shifted from the low-power consumption mode to the normal power mode. Thus, the main body unit 10 can recognize that the sensor amplifier 30 is now able to receive the data transmission request (see Step S30). After that, the main body unit 10 can acquire the input signals (measurement data) by Steps S30 and S32.

Here, in the measurement of the physical quantity (such as noise or vibration), the constant monitoring may not be necessary; for example, the data are transmitted once in several minutes (or transmitted every 30 minutes). Moreover, the sensor amplifier 30 may be located in an area where the operator cannot enter or cannot easily enter. In those cases, in this embodiment, the wake-up instruction is transmitted from the main body unit 10 when the start time for the intended measurement has come. Thus, the sensor amplifier 30 can start the measurement. Accordingly, the sensor amplifier 30 can be operated only when necessary, so that the power can be saved and the power consumption can be reduced.

Figure 9:
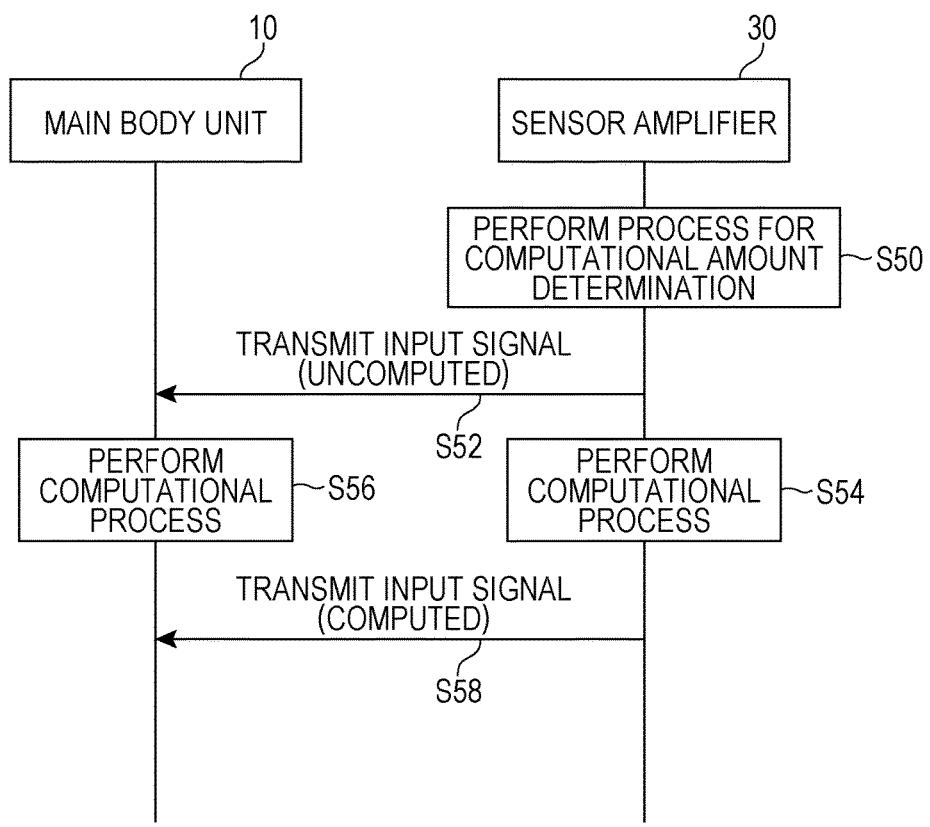
FIG. 9 is a sequence diagram illustrating a procedure example of a load distribution process.

Here, the load distribution process is described. FIG. 9 is a sequence diagram illustrating the procedure example of the load distribution process. The load distribution process is the process for distributing the load of the data processing (for example, FFT) by making the sensor amplifier 30 and the main body unit 10 work in cooperation. Although not illustrated, the sensor amplifier 30 has a plurality of sensors connected thereto. The sensor amplifier 30 performs the measurement in multiple channels.

Step S50: the sensor amplifier 30 executes the amount of data processing determination process. Specifically, the sensor amplifier 30 determines whether the amount of data processing is more than the prescribed value (the number of channels (the number of input signals)). The amount of data processing determination process is performed based on the setting content for a predetermined rule of the data process. The setting content is the information managed by the main body unit 10. When the load distribution process is performed, the information about the setting content is transmitted from the main body unit 10 to the sensor amplifier 30. Note that the information about the setting content may be managed in the sensor amplifier 30. Here, it is assumed that the sensor amplifier 30 determines that the number of channels is more than the prescribed value (for example, three channels).

Step S52: if the number of channels is more than or equal to the prescribed value, the sensor amplifier 30 transmits the input signals for the prescribed value (for example, two channels) to the main body unit 10. The input signals transmitted here correspond to the data for which the data processing is not executed yet (unprocessed data). Specifically, the sensor amplifier 30 transmits the unprocessed input signals to the main body unit 10 through the first wireless communication unit 91.

Step S54: the sensor amplifier 30 performs the data processing in its own data processing unit 72 (sensor amplifier data processing unit). The data processing performed here is the data processing for the input signals for the number more than the prescribed value (the remaining one channel, as this example).

Step S56: similarly, the main body unit 10 executes the data processing in its own data processing unit 82 (main body data processing unit). Specifically, the main body unit 10 computes the input signal for the prescribed value in its own data processing unit 82.

Step S58: the sensor amplifier 30 transmits the computed input signals to the main body unit 10. The input signals transmitted here are the data for which the data processing has already been executed (computed data). Specifically, the sensor amplifier 30 transmits the computed input signals to the main body unit 10 through the first wireless communication unit 91.

In this manner, in the case where the amount of data processing for the main body unit 10 is too large for the main body unit 10 to process the input signals, the sensor amplifier 30 can share the data processing, too. As a result, the data processing can be distributed. Thus, the hardware resources can be used effectively.

Figure 10:
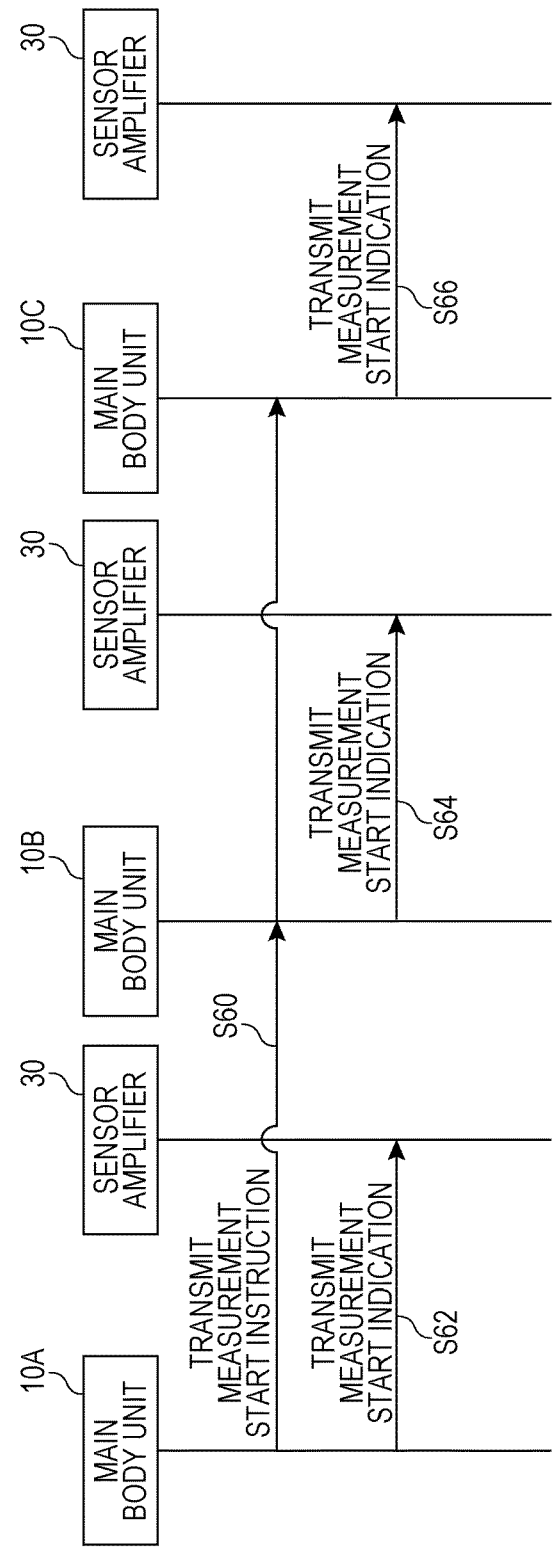
FIG. 10 is a sequence diagram illustrating a procedure example of a network trigger process.

Next, the network trigger process is described. FIG. 10 is a sequence diagram illustrating the procedure example of the network trigger process. In the case the network trigger process is performed, a plurality of main body units 10 is used. The plurality of main body units 10 are connected to each other through a predetermined network (for example, network 70). Note that the network trigger process is the process for, according to the trigger (such as the signal for starting the measurement) made on the network, starting the devices belonging to that network. One of the main body units 10 is worked as a control unit that controls the other main body units.

The illustrated example includes three main body units 10 (10A, 10B, and 10C). The main body unit 10A on the left side is the control unit. The two main body units 10B and 10C on the right side are the units managed by the main body unit 10A. Each main body unit 10 has the sensor amplifier 30 connected thereto wirelessly. Although not illustrated, the sensor amplifiers 30 are provided with various kinds of sensors.

Step S60: the main body unit 10A transmits the measurement start instruction for starting the measurement of the physical quantity to the main body units 10B and 10C through the predetermined network (notification unit for a measurement start instruction).

Step S62: in the case of having transmitted the measurement start instruction, the main body unit 10A transmits the measurement start indication (a control signal) to the sensor amplifier 30 connected to the main body unit 10A. Thus, the measurement of the physical quantity is started.

Steps S64 and S66: upon the reception of the measurement start instruction, the main body units 10B and 10C transmit the measurement start indication to the measurement units connected to the main body units 10B and 10C. Thus, the main body units 10B and 10C cause the sensors connected to the main body units 10B and 10C to start the measurement of the physical quantity (measurement execution unit).

Thus, according to this control method, by using the measurement start instruction, the main body units 10B and 10C can be linked to be operated according to the information from the main body unit 10A serving as the control unit. Therefore, the main body units 10 and the sensor amplifiers 30 located apart from each other can be efficiently controlled.

Figure 11:
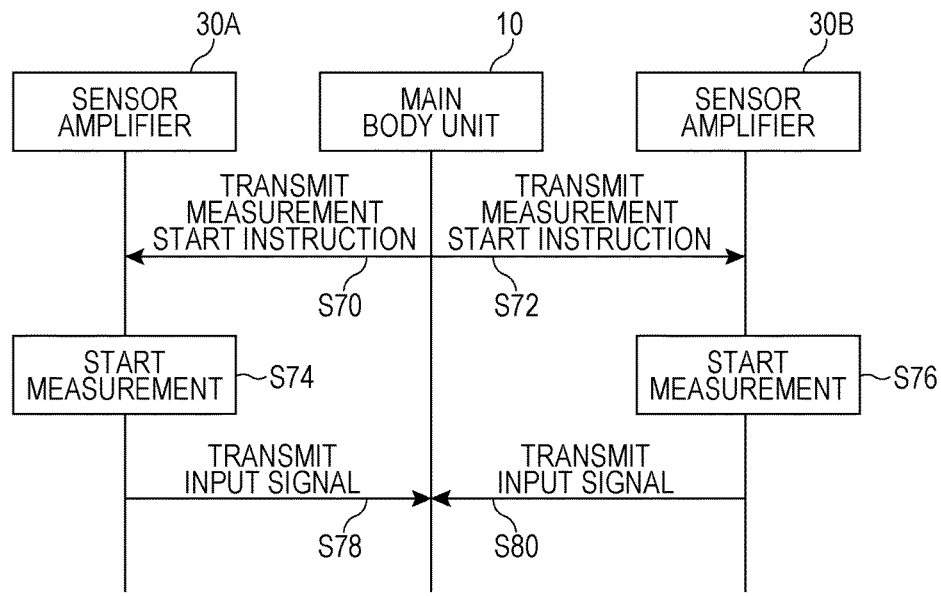
FIG. 11 is a sequence diagram illustrating a procedure example of a measurement process when the plurality of sensor amplifiers 30 is connected to one main body unit 10.

FIG. 11 is a sequence diagram illustrating the procedure example of the measurement process when the plurality of sensor amplifiers 30 is connected to one main body unit 10. In the illustrated example, two sensor amplifiers 30 (30A and 30B) are connected to one main body unit 10. This makes one main body unit 10 control the two sensor amplifiers 30A and 30B. Although not illustrated, the sensor amplifiers 30A and 30B have various kinds of sensors attached thereto.

Step S70: the main body unit 10 transmits the measurement start instruction for starting the measurement of the physical quantity to the sensor amplifier 30A (notification unit for a measurement start instruction). Specifically, the main body unit 10 notifies the sensor amplifier 30A of the measurement start instruction through the first wireless communication unit 85.

Step S72: the main body unit 10 transmits the measurement start instruction for starting the measurement of the physical quantity to the sensor amplifier 30B at the same time (notification unit for a measurement start instruction). Specifically, the main body unit 10 notifies the sensor amplifier 30B of the measurement start instruction through the first wireless communication unit 85.

Steps S74 and S76: upon the reception of the measurement start instruction, the sensor amplifiers 30A and 30B cause the sensors connected to the sensor amplifiers 30A and 30B to start to measure the physical quantity.

Step S78: upon the start of the measurement of the physical quantity, the sensor amplifier 30A transmits the input signal to the main body unit 10.

Step S80: upon the start of the measurement of the physical quantity, the sensor amplifier 30B similarly transmits the input signal to the main body unit 10.

According to this process procedure, the sensor amplifiers 30A and 30B connected to one main body unit 10 can be linked to be operated by using the measurement start instruction. This enables the simultaneous start of the measurement between the sensors connected to the sensor amplifiers 30A and 30B at a distant position from each other.

Here, the main body unit 10 transmits the measurement start instruction at the same time to the two sensor amplifiers 30A and 30B. Therefore, it is assumed that the input signals are received from the sensor amplifiers 30A and 30B also at the same time. Thus, when the plurality of sensor amplifiers 30 are connected to one main body unit 10, the communication bands may become insufficient. Therefore, in this case, the time-divisional communication process as below is executed.

Figure 12:
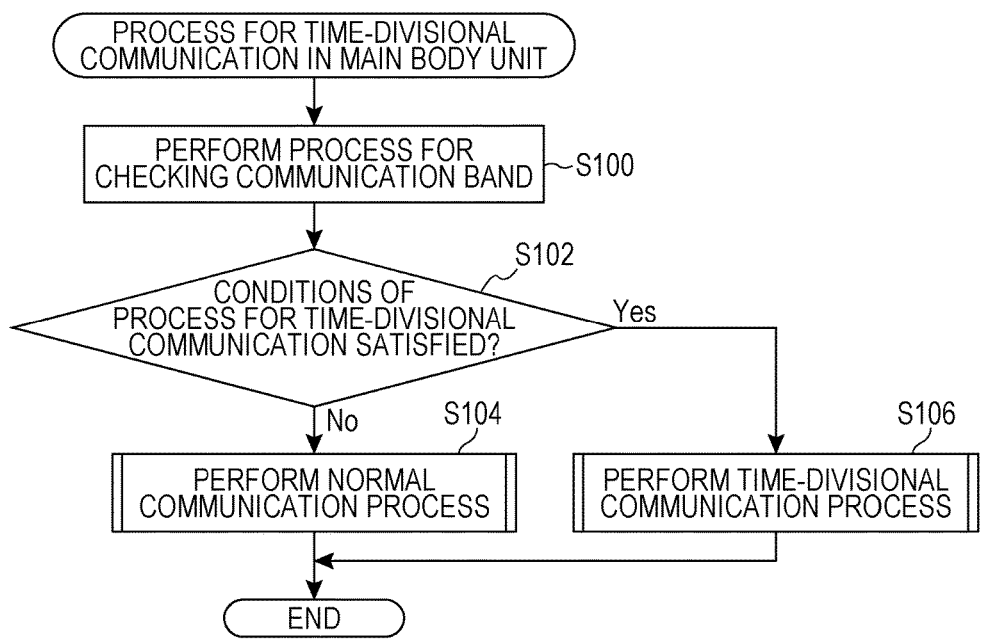
FIG. 12 is a flowchart illustrating a procedure example of a main body unit time-divisional communication process.

FIG. 12 is a flowchart of the procedure example of the main body unit time-divisional communication process.

Step S100: the control unit 81 of the main body unit 10 executes the communication band checking process. This process is to check whether, in the case a number of sensor amplifiers 30 are connected to the main body unit 10, the communication bands enough to obtain the measurement data at the same time from all the units can be secured or not.

Step S102: the control unit 81 checks if the execution condition for the time-divisional communication process is satisfied or not. Specifically, the control unit 81 checks if a desired communication band has been secured by the previous communication band checking process. If it has been determined that the execution condition for the time-divisional communication process is not satisfied (No), the control unit 81 executes Step S104 next. If it has been determined that the execution condition for the time-divisional communication process is satisfied (Yes), the control unit 81 executes Step S106 next.

Step S104: the control unit 81 executes the normal communication process. If this process is to be performed, the communication bands enough to obtain the measurement data at the same time from all the units are secured. Therefore, the control unit 81 receives the input signal from each sensor amplifier 30.

Step S106: the control unit 81 executes the time-divisional communication process. If this process is to be performed, the communication bands enough to obtain the measurement data at the same time from all the units are not secured. Therefore, the control unit 81 receives the input signal sequentially and time-divisionally from the sensor amplifiers 30. When the time-divisional communication process is performed, the control unit 81 transmits the request for transmitting the input signal or the request for stopping the transmission of the input signal to each sensor amplifier 30 according to the divided time. Note that the main body unit 10 can select one of the normal communication process or the time-divisional transmission process by repeating the above processes (from Step S100 to Step S106).

Figure 13:
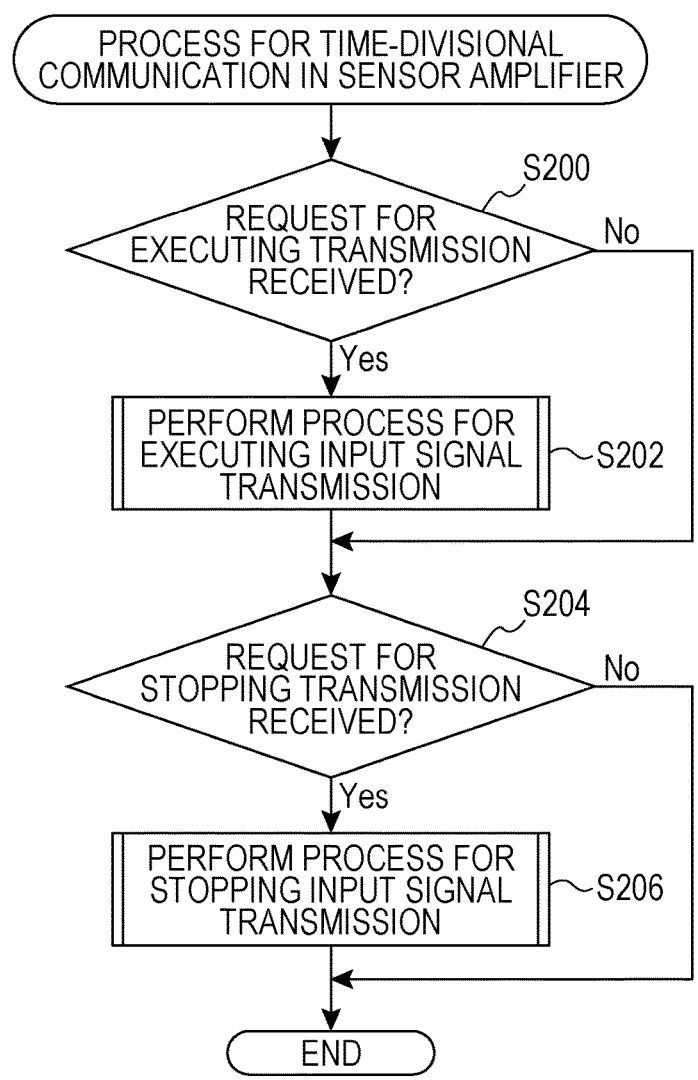
FIG. 13 is a flowchart illustrating a procedure example of a sensor amplifier time-divisional communication process.

FIG. 13 is a flowchart of the procedure example of the sensor amplifier time-divisional communication process.

Step S200: the main control unit 73 of the sensor amplifier 30 checks whether the transmission execution request has been received from the main body unit 10 or not. If it has been determined that the transmission execution request is received from the main body unit 10 (Yes), the main control unit 73 executes Step S202 next. If it has been determined that the transmission execution request is not received from the main body unit 10 (No), the main control unit 73 does not execute Step S202.

Step S202: the main control unit 73 executes the input signal transmission execution process. Through this process, the input signal is transmitted from the sensor amplifier 30 to the main body unit 10.

Step S204: the main control unit 73 checks whether the transmission stop request has been received from the main body unit 10 or not. If it has been determined that the transmission stop request is received from the main body unit 10 (Yes), the main control unit 73 executes Step S206 next. If it has been determined that the transmission stop request is not received from the main body unit 10 (No), the main control unit 73 does not execute Step S206.

Step S206: the main control unit 73 executes the input signal transmission stop process. Through this process, if the input signal has been transmitted to the main body unit 10, the transmission of the input signal is stopped. Note that the sensor amplifier 30 can execute the time-divisional transmission process by repeating the above processes (from Step S200 to Step S206).

By executing of the time-divisional communication process as above, the main body unit 10 can collect all of the measurement data (input signals) from the sensor amplifiers 30 through such time-divisional process even when the communication bands enough to obtain the data at the same time from the plurality of sensor amplifiers 30 cannot be secured.

[Example of Measurement Circumstances]

Next, a suitable measurement condition and circumstance of the measuring system 100 is described.

[Indoor Multi-point Measurement, Measurement of Noise or Vibration]

Figure 14:
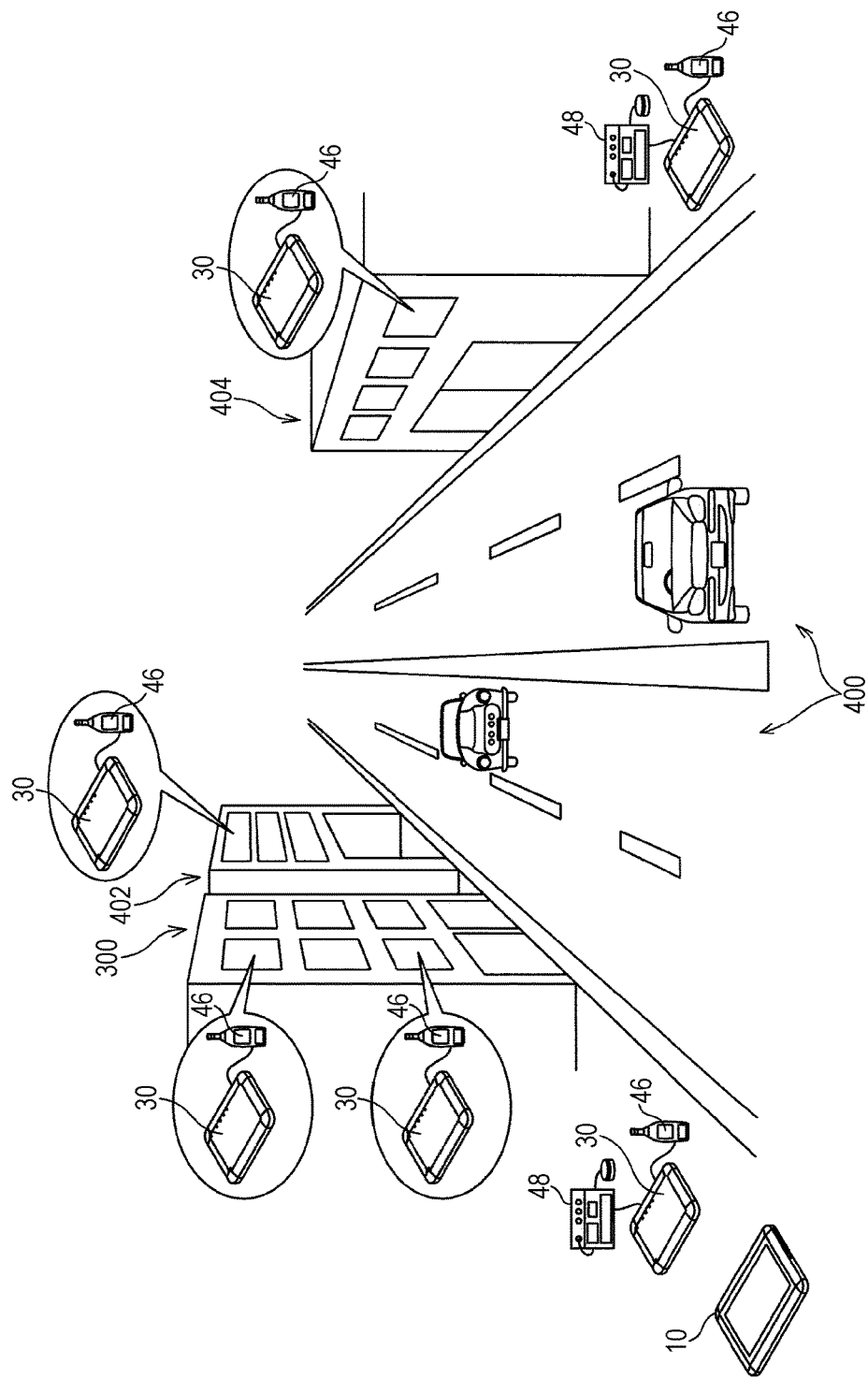
FIG. 14 is a diagram illustrating a state of the indoor multi-point measurement and the measurement of noise or vibration.

FIG. 14 is a diagram illustrating the indoor multi-point measurement and the measurement of noise or vibration. The indoor multi-point measurement is the measurement of noise, vibration, or the like in a condominium 300 like an apartment building. In the indoor multi-point measurement, the noise and vibration in the building are measured from the outside of the condominium 300. In addition, the measurement is often conducted at multiple points at the same time in a plurality of rooms. The measurement at the multiple points in the rooms on the same floor or close floors is possible by arranging to set the cables. In this case, however, it is still much burden for the operator. Further, the simultaneous measurement at the multiple points on the different floors is to be given up. So it must be needed to conduct the measurement at every floor one by one.

In this regard, even in such measurement condition and circumstance, the simultaneous measurement is easily possible by using the measurement system 100 of this embodiment. In the illustrated example, the main body unit 10 is set outside the condominium 300. Moreover, the sensor amplifiers 30 provided with the sound level meters 46 are set at each of the second floor and the fourth floor of the condominium 300. The measurement data are transmitted wirelessly from the sensor amplifier 30 to the main body unit 10.

Thus, the operator can monitor the status in real time by checking with the main body unit 10. In addition, when an on-site monitoring locates a strange-noise generating site, the operator can increase the sensor amplifiers 30 provided with the sound level meters 46, as needed. This means the operator can increase the measurement points flexibly. Thus, from time to time, the operator can conduct an additional measurement at the point likely to be causing the noise.

In the illustrated example, the sensor amplifiers 30 provided with the sound level meters 46 are set inside a building 402 on the left side of a road 400 and a building 404 on the right side of the road 400. Moreover, on each side of the road 400, the sensor amplifiers 30 provided with a vibration level meters 48 in addition to the sound level meter 46 are set. This enables the wider range of measurement on the area facing the road in this measurement example.

Even if the signal transfer is stopped because the automobile passes on the road in the middle of the sound measurement, the measurement can be completed without causing any deficiency in the measurement data, with executing the real-time transfer or the batch transfer.

With the description mentioned above, this embodiment has the good effects as below.

(1) The sensor amplifier 30 stores the signal to transmit wirelessly in itself. Therefore, it is possible to deal with the deficiency in the data in the wireless communication flexibly.

(2) The main body unit 10 and the sensor amplifier 30 use the two different kinds of wireless communication units depending on the circumstances; thus, the power consumption can be reduced efficiently.

(3) If the main body unit 10 cannot process all the input signals, the sensor amplifier 30 can assist with processing the portions of the signals, which could not be processed by the main body 10. Therefore, by distributing the data processing, the hardware resources can be effectively used.

(4) By using the measurement start instruction from the main body unit 10, the sensors connected to the sensor amplifiers 30A and 30B can start the measurement. Thus, a highly regulated, synchronized measurement can be achieved.

The disclosed invention is not limited by the above embodiment. Various modifications of the disclosed invention are possible. This invention can be applied to various measurement conditions and circumstances in addition to the aforementioned measurement conditions and circumstances.

LIST OF REFERENCE NUMERALS

10 Main body unit
30 Sensor amplifier
100 Measurement system

The invention claimed is:

1. A measurement system comprising:
a sensor amplifier connected to a sensor configured to output an analog signal corresponding to a measured physical quantity and a main terminal paired with the sensor amplifier, the sensor amplifier comprising:
 a first sensor-amplifier wireless transceiver;
 a second sensor-amplifier wireless transceiver having a power consumption less than that of the first sensor-amplifier wireless transceiver;
 a state-control processor configured to:
  shift the first sensor-amplifier wireless transceiver from an operating state to a suspended state and to maintain the operating state of the second sensor-amplifier wireless transceiver upon receiving an instruction from the main terminal to shift to a low-power-consumption mode, wherein the low-power consumption mode includes a first low-power consumption mode and a second low-power consumption mode with a power consumption less than that of the first low-power consumption mode; and
  shift the first sensor-amplifier wireless transceiver from the suspended state to the operating state upon receiving an instruction from the main terminal to shift to a normal power mode;
 a sensor-amplifier processor configured to control a measurement state of the sensor and the state-control processor has a power consumption less than that of the sensor-amplifier processor; and
the main terminal comprising:
 a first main-terminal wireless transceiver paired with the first sensor-amplifier wireless transceiver to communicate therewith;
 a second main-terminal wireless transceiver having a power consumption less than that of the first main terminal wireless transceiver and paired with the second sensor-amplifier wireless transceiver to communicate therewith; and
 a main-terminal processor configured to:
  transmit an instruction to shift to the low-power-consumption mode to the sensor amplifier via the first main-terminal wireless transceiver or the second main-terminal wireless transceiver;
  transmit an instruction to shift from the low-power consumption mode to the normal power mode to the sensor amplifier via the second main-terminal wireless transceiver;
  transmit an instruction to shift to the first low-power consumption mode to the sensor amplifier via the first main terminal wireless transceiver or the second main terminal wireless transceiver;
  transmit an instruction to shift to the second low-power consumption mode to the sensor amplifier via the first main terminal wireless transceiver or the second main terminal wireless transceiver;
  shift the first sensor-amplifier wireless transceiver from an operating state to a suspended state upon receiving an instruction from the main terminal to shift to the first low-power-consumption mode; and
  shift the sensor-amplifier processor and the first sensor-amplifier wireless transceiver from the operating state to the suspended state upon receiving an instruction from the main terminal to shift to the second low-power consumption mode.

2. A measurement system comprising:
a sensor amplifier connected to a plurality of sensors configured to output analog signals corresponding to measured physical quantities and a main terminal paired with the sensor amplifier, the sensor amplifier comprising:
 an A/D converter configured to convert the analog signals received from the sensors into digital signals;
 a sensor-amplifier signal processor configured to process the digital signals for a subset of the plurality of sensors based on a predetermined rule, wherein the predetermined rule establishes a maximum number of sensors of the plurality of sensors whose digital signals are to be transmitted to the main terminal as unprocessed digital signals and wherein the digital signals for the subset of the plurality of sensors processed by the sensor-amplifier signal processor comprise the digital signals of sensors of the plurality of sensors exceeding the maximum number of sensors of the plurality of sensors established by the predetermined rule;
a sensor-amplifier wireless transceiver configured to transmit the unprocessed digital signals and the processed digital signals; and the main terminal comprising:
a main terminal wireless transceiver configured to receive both the unprocessed digital signals and the processed digital signals transmitted from the sensor amplifier; and
a main-terminal processor configured to process the unprocessed digital signals received from the sensor amplifier.

* * * * *